United States Patent
Katami et al.

(10) Patent No.: US 10,265,927 B2
(45) Date of Patent: Apr. 23, 2019

(54) TRANSPARENT ELECTROCONDUCTIVE LAYER-EQUIPPED COVER ELEMENT PROVIDED WITH TRANSPARENT PRESSURE-SENSITIVE ADHESIVE LAYER

(71) Applicant: NITTO DENKO CORPORATION, Ibaraki-shi, Osaka (JP)

(72) Inventors: Hirofumi Katami, Ibaraki (JP); Atsushi Yasui, Ibaraki (JP)

(73) Assignee: NITTO DENKO CORPORATION, Ibaraki-shi, Osaka (JP)

( * ) Notice: Subject to any disclaimer, the term of this patent is extended or adjusted under 35 U.S.C. 154(b) by 0 days.

(21) Appl. No.: 15/543,211

(22) PCT Filed: Jul. 11, 2016

(86) PCT No.: PCT/JP2016/070436
§ 371 (c)(1),
(2) Date: Jul. 12, 2017

(87) PCT Pub. No.: WO2017/014089
PCT Pub. Date: Jan. 26, 2017

(65) Prior Publication Data
US 2017/0368786 A1    Dec. 28, 2017

(30) Foreign Application Priority Data
Jul. 22, 2015  (JP) .................. 2015-145221

(51) Int. Cl.
*G02B 1/111*    (2015.01)
*G02B 1/00*    (2006.01)
(Continued)

(52) U.S. Cl.
CPC ................ *B32B 3/26* (2013.01); *B32B 7/02* (2013.01); *C09F 9/00* (2013.01); *C09J 7/00* (2013.01);
(Continued)

(58) Field of Classification Search
CPC ......... B32B 3/26; B32B 2307/50; B32B 7/02; B32B 2307/418; C09F 9/00; C09J 201/00;
(Continued)

(56) References Cited

U.S. PATENT DOCUMENTS 4,556,595 A    12/1985 Ochi
5,008,139 A    4/1991 Ochi et al.
(Continued)

FOREIGN PATENT DOCUMENTS

CN    103228748 A    7/2013
CN    105189678 A    12/2015
(Continued)

OTHER PUBLICATIONS

Google Translation for Kishioka et al (JP 2005105228 A), Originally published Apr. 2005.*
(Continued)

*Primary Examiner* — Nathan L Van Sell
(74) *Attorney, Agent, or Firm* — Hauptman Ham, LLP

(57) ABSTRACT

The present invention provides a transparent electroconductive layer-equipped cover element having a pressure-sensitive adhesive sheet preliminarily laminated thereto, wherein the pressure-sensitive adhesive sheet comprises a pressure-sensitive adhesive layer in which a refractive index adjustment zone having a refractive index greater than that of a base pressure-sensitive adhesive material thereof is formed over a given range from a surface of the pressure-sensitive adhesive layer in a thickness direction thereof, whereby: in a lamination process of a customer which is a supply destination of the transparent electroconductive layer-equipped cover element, it becomes possible to eliminate a need to distinguish between obverse and reverse sides of the pressure-sensitive adhesive sheet itself; and, when the trans- (Continued)

parent electroconductive layer-equipped cover element is bonded to an optical element through the pressure-sensitive adhesive layer, it becomes possible to suppress internal reflection in a laminate formed of these optical elements.

13 Claims, 8 Drawing Sheets

(51) Int. Cl.
| | |
|---|---|
| G06F 3/041 | (2006.01) |
| C09J 7/38 | (2018.01) |
| C09J 7/00 | (2018.01) |
| C09J 201/00 | (2006.01) |
| C09J 9/00 | (2006.01) |
| B32B 7/02 | (2006.01) |
| B32B 3/26 | (2006.01) |
| G09F 9/00 | (2006.01) |
| C09F 9/00 | (2006.01) |
| H01J 37/26 | (2006.01) |
| C01B 11/00 | (2006.01) |

(52) U.S. Cl.
CPC .............. *C09J 7/38* (2018.01); *C09J 201/00* (2013.01); *G06F 3/041* (2013.01); *G09F 9/00* (2013.01); B32B 2307/418 (2013.01); B32B 2307/50 (2013.01); C01B 11/00 (2013.01); C09J 2201/36 (2013.01); C09J 2201/602 (2013.01); C09J 2203/318 (2013.01); C09J 2400/143 (2013.01); C09J 2423/006 (2013.01); C09J 2433/00 (2013.01); C09J 2467/006 (2013.01); C09J 2469/006 (2013.01); G02B 1/00 (2013.01); G02B 1/111 (2013.01); H01J 37/26 (2013.01)

(58) Field of Classification Search
CPC . C09J 7/00; C09J 2469/006; C09J 7/38; C09J 2433/00; C09J 2423/006; C09J 2400/143; C09J 2203/318; C09J 2201/602; C09J 2467/006; C09J 2201/36; G06F 3/041; G02B 1/00; G02B 1/111; H01J 37/26; C01B 11/00; G09F 9/00
See application file for complete search history.

(56) References Cited

U.S. PATENT DOCUMENTS

| | | | | |
|---|---|---|---|---|
| 6,288,172 | B1* | 9/2001 | Goetz | C09J 7/38 |
| | | | | 525/200 |
| 8,202,927 | B2* | 6/2012 | Hiwatashi | C09J 133/08 |
| | | | | 524/406 |
| 8,829,079 | B2* | 9/2014 | Shultz | B82Y 30/00 |
| | | | | 523/200 |
| 9,477,354 | B2 | 10/2016 | Hao et al. | |
| 9,631,126 | B2 | 4/2017 | Lee et al. | |
| 9,719,770 | B2 | 8/2017 | Takao et al. | |
| 2002/0098352 | A1 | 7/2002 | Kishioka | |
| 2010/0210772 | A1* | 8/2010 | Hiwatashi | C09J 133/08 |
| | | | | 524/407 |
| 2011/0151249 | A1 | 6/2011 | Yamanaka et al. | |
| 2011/0288215 | A1* | 11/2011 | Shultz | B82Y 30/00 |
| | | | | 524/204 |
| 2012/0200931 | A1* | 8/2012 | Haag | G02B 5/0247 |
| | | | | 359/599 |
| 2013/0039094 | A1* | 2/2013 | Kolb | B29C 41/24 |
| | | | | 362/618 |
| 2013/0059120 | A1* | 3/2013 | Shi | B32B 7/12 |
| | | | | 428/147 |
| 2013/0154473 | A1 | 6/2013 | Kaneko et al. | |
| 2013/0241862 | A1 | 9/2013 | Kim et al. | |
| 2013/0295349 | A1* | 11/2013 | Yamasaki | G06F 3/0412 |
| | | | | 428/203 |
| 2014/0138131 | A1 | 5/2014 | Hao et al. | |
| 2014/0193598 | A1* | 7/2014 | Traser | C09J 7/00 |
| | | | | 428/41.3 |
| 2014/0255679 | A1* | 9/2014 | Goeb | C09J 7/00 |
| | | | | 428/305.5 |
| 2014/0377554 | A1* | 12/2014 | Cho | C09J 7/20 |
| | | | | 428/355 EN |
| 2015/0022222 | A1 | 1/2015 | Takao et al. | |
| 2016/0084991 | A1 | 3/2016 | Umemoto et al. | |
| 2016/0115357 | A1 | 4/2016 | Katami et al. | |
| 2016/0200949 | A1 | 7/2016 | Lee et al. | |

FOREIGN PATENT DOCUMENTS

| | | |
|---|---|---|
| CN | 105190367 A | 12/2015 |
| EP | 2644670 A2 | 10/2013 |
| JP | 52-133339 A | 11/1977 |
| JP | 58-13682 A | 1/1983 |
| JP | 63-238184 A | 10/1988 |
| JP | 1-118584 A | 5/1989 |
| JP | 11-223712 A | 8/1999 |
| JP | 2003-131032 A | 5/2003 |
| JP | 2003-342546 A | 12/2003 |
| JP | 2005-105228 A | 4/2005 |
| JP | 2007-305679 A | 11/2007 |
| JP | 2008-106242 A | 5/2008 |
| JP | 2009-120726 A | 6/2009 |
| JP | 2009-279862 A | 12/2009 |
| JP | 4640740 B2 | 3/2011 |
| JP | 2011-127034 A | 6/2011 |
| JP | 2013-202844 A | 10/2013 |
| JP | 2014-502292 A | 1/2014 |
| JP | 5520752 B2 | 6/2014 |
| JP | 5564748 B2 | 8/2014 |
| KR | 10-2012-0055454 A | 5/2012 |
| KR | 10-2013-0110089 A | 10/2013 |
| KR | 10-2015-0112003 A | 10/2015 |
| KR | 10-2015-0114548 A | 10/2015 |
| TW | 201231606 A1 | 8/2012 |
| TW | 201400295 A | 1/2014 |
| TW | 201542380 A | 11/2015 |
| TW | 201542749 A | 11/2015 |
| WO | 2012/070791 A2 | 5/2012 |
| WO | 2015031246 A1 | 3/2015 |
| WO | 2015/108159 A1 | 7/2015 |
| WO | 2015/108160 A1 | 7/2015 |

OTHER PUBLICATIONS

International Search Report dated Oct. 4, 2016 for PCT/JP2016/070436.
The Written Opinion and Search Report dated Dec. 14, 2017 for corresponding Singapore Patent Application No. 11201706975Y.
Japanese Office Action dated Apr. 23, 2018 for corresponding Japanese Application No. 2017-127141.
Korean Office Action dated May 31, 2018 for corresponding Korean Application No. 10-2017-7019308.

* cited by examiner

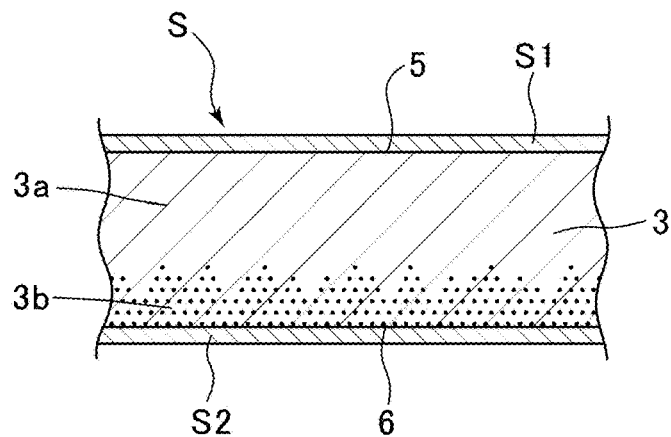
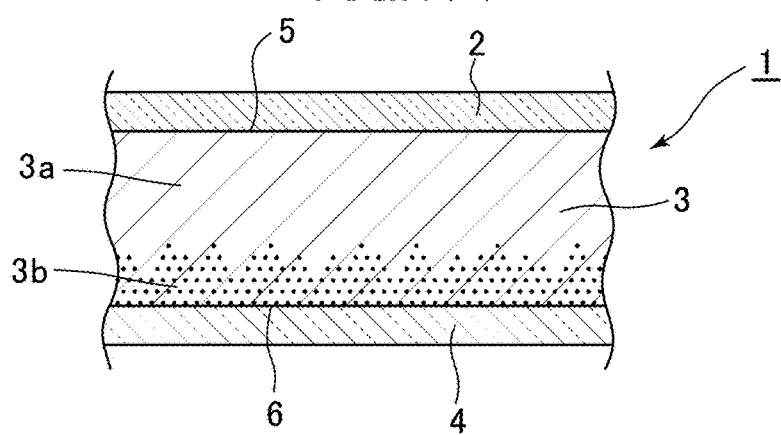
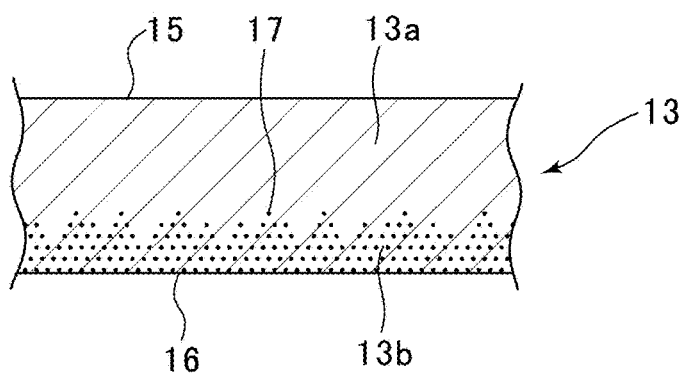

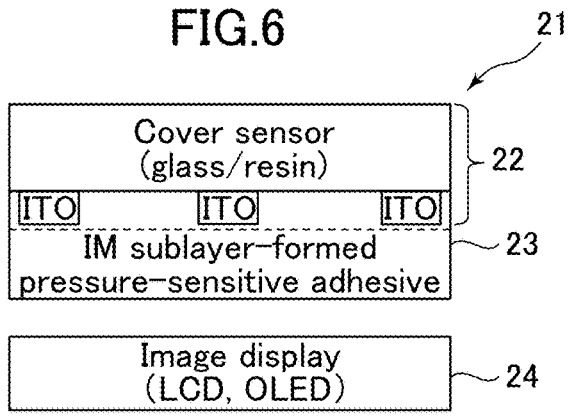
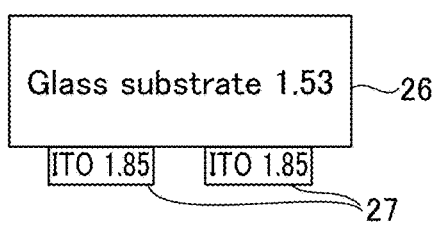 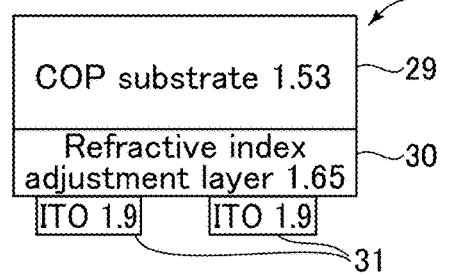
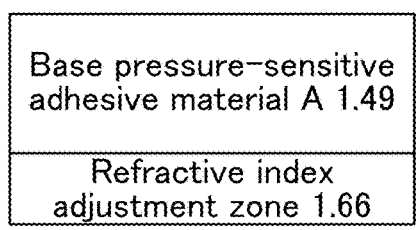 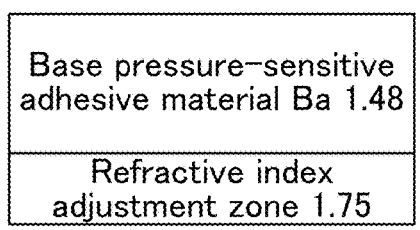
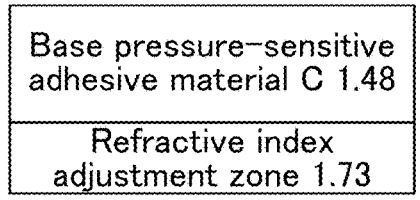 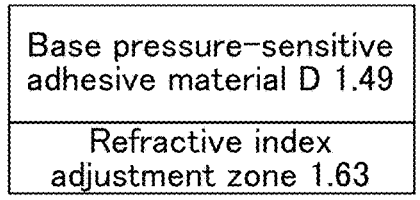

TRANSPARENT ELECTROCONDUCTIVE LAYER-EQUIPPED COVER ELEMENT PROVIDED WITH TRANSPARENT PRESSURE-SENSITIVE ADHESIVE LAYER

CROSS REFERENCE TO RELATED APPLICATION

This application claims the priority of Japanese Patent Application No. 2015-145221, filed on Jul. 22, 2015, in the JPO (Japanese Patent Office). Further, this application is the National Phase Application of International Application No. PCT/JP2016/070436, filed on Jul. 11, 2016, which designates the United States and was published in Japan. Both of the priority documents are hereby incorporated by reference in their entireties.

TECHNICAL FIELD

The present invention relates to a transparent electroconductive layer-equipped cover element provided with a transparent pressure-sensitive adhesive layer. In particular, the present invention relates to a transparent electroconductive layer-equipped cover element provided with a transparent pressure-sensitive adhesive layer usable for bonding a transparent optical element to another, second, optical element.

BACKGROUND ART

In a display device such as a liquid crystal display device or an organic EL display device, a pressure-sensitive adhesive is used to bond a transparent optical element, such as a polarizing film, a retardation film or a transparent cover element including a cover glass, to another optical element. That is, a pressure-sensitive adhesive layer is disposed between two optical elements to be bonded together, and then the two optical elements are pressed against each other and bonded together to thereby form an optical element laminate. In a display device, the optical element laminate configured as above is disposed such that the transparent optical element is located on a viewing side. This configuration involves a problem that, when outside light enters from the transparent optical element on the viewing side, the entered light is reflected at an interface between the pressure-sensitive adhesive layer and the optical element on a non-viewing side, and returned to the viewing side. This problem becomes prominent particularly when an entry angle of outside light is relatively large.

On the other hand, in a touch panel-equipped display device which has been increasingly becoming popular in late years, a transparent electroconductive layer such as a patterned ITO (Indium Tin Oxide) layer is formed on a surface of a bonding-target optical element to which a transparent optical element is to be bonded. In this type of display device, the problem "poor pattern invisibility" is pointed out that a pattern of the transparent electroconductive layer becomes visible from the viewing side, by the influence of internal reflection of entered light at an interface between a pressure-sensitive adhesive layer and the transparent electroconductive layer.

In each case, the internal reflection is caused by a difference in refractive index between the pressure-sensitive adhesive layer and each of the bonding-target optical element and the transparent electroconductive layer. JP 4640740 B (Patent Document 1) teaches a technique for addressing this problem. Specifically, the Patent Document 1 discloses a pressure-sensitive adhesive composition capable of reducing total reflection of light at an interface between a transparent optical element and a pressure-sensitive adhesive layer and at an interface between the pressure-sensitive adhesive layer and a bonding-target optical element. The composition disclosed in the Patent Document 1 is allegedly described as having a high refractive index in its dried and/or cured states, wherein it is close to refractive indexes of the transparent optical element and the bonding-target optical element body. The teaching of the Patent Document 1 is that a pressure-sensitive adhesive layer for bonding two optical elements together is entirely formed to have a refractive index close to refractive indexes of the two optical elements.

The technique taught by the Patent Document 1 would be effective in suppressing the interface reflection. On the other hand, there is a problem that the composition itself becomes costly, because this technique is based on the use of a particular monomer component.

JP 5564748 B (Patent Document 2) discloses a refractive index-adjusted pressure-sensitive adhesive which comprises a transparent base pressure-sensitive adhesive material comprised of an acrylic-based resin, and zirconium oxide or titanium oxide particles having an average dispersed particle size of 1 nm to 20 nm, wherein the zirconium oxide or titanium oxide particles are dispersed over the entire thickness of the transparent base pressure-sensitive adhesive layer. In this pressure-sensitive adhesive, the zirconium oxide or titanium oxide particles as a high refractive index material are mixed with the transparent base pressure-sensitive adhesive material. Thus, it is considered that a refractive index of a layer of the pressure-sensitive adhesive can be increased in its entirety to thereby suppress the aforementioned interface reflection. However, the technique disclosed in the Patent Document 2 requires using the high refractive index material in large amounts. This causes a concern about deterioration in properties required as a pressure-sensitive adhesive, and a problem of an increase in cost. Moreover, the high refractive index material used in the Patent Document 2 is particles of an inorganic material. Thus, there is another problem that the particles are hardly dispersed, causing whitish haze due to light scattering. In this regard, it is conceivable to use particles of an organic material. In this case, however, it becomes difficult to solve a problem of coloration.

With a view to improving the technique disclosed in the Patent Document 2, JP 5520752 B (Patent Document 3) proposes coating, with a polymer, metal oxide particles to be dispersed in a pressure-sensitive adhesive. The teaching of the Patent Document 3 is that, although the pressure-sensitive adhesive layer in the Patent Document 2 has a problem of deterioration in adherence property thereof because the metal oxide particles are exposed to a surface of the pressure-sensitive adhesive layer, this problem can be solved by coating the metal oxide particles with a polymer. The technique proposed by the Patent Document 3 could have a potential to improve the adherence property of the pressure-sensitive adhesive layer to some extent. However, it cannot solve most of the remaining problems pointed out in connection with the Patent Document 2. In particular, the technique described in the Patent Document 3 is based on coating the metal oxide particles with a particular polymer. Thus, the resulting pressure-sensitive adhesive becomes more costly than that in the Patent Document 2.

CITATION LIST

Patent Document

Patent Document 1: JP 4640740 B
Patent Document 2: JP 5564748 B
Patent Document 3: JP 5520752 B

SUMMARY OF INVENTION

Technical Problem

It is a primary object of the present invention to provide a transparent electroconductive layer-equipped cover element having a pressure-sensitive adhesive sheet laminated thereto, wherein the pressure-sensitive adhesive sheet comprises a pressure-sensitive adhesive layer capable of being easily produced at low cost and effectively suppressing internal reflection when used for bonding of an optical element laminate.

A pressure-sensitive adhesive sheet having a refractive index adjustment zone (refractive index adjustment zone-formed pressure-sensitive adhesive sheet) is offered with two PET separators laminated to opposite sides thereof, so that it is difficult to distinguish between obverse and reverse sides of the pressure-sensitive adhesive sheet itself. Examples of a way to distinguish therebetween include distinguish between the obverse and reverse sides based on a difference in peel force during peel-off of the PET separators. For example, the obverse and reverse sides of the refractive index adjustment zone-formed pressure-sensitive adhesive sheet can be distinguished by configuring the sheet such that one of the PET separators laminated to one surface of the pressure-sensitive adhesive layer defined by the refractive index adjustment zone can be peeled off by a relatively small peel force (light peelability), and the other PET separator laminated to the other surface of the pressure-sensitive adhesive layer can be peeled off by a relatively large peel force (heavy peelability). However, a difference in peeling force needs to be set to about 1.5 to 3 times. This leads to a problem of difficulty in adjusting a balance with peel force necessary as a carrier sheet in a lamination process of a customer which is a supply destination of the refractive index adjustment zone-formed pressure-sensitive adhesive sheet.

Solution to Technical Problem

In brief, in order to solve this problem and achieve the above object, the present invention provides a transparent electroconductive layer-equipped cover element having a pressure-sensitive adhesive sheet preliminarily laminated thereto, wherein the pressure-sensitive adhesive sheet comprises a pressure-sensitive adhesive layer in which a refractive index adjustment zone having a refractive index greater than that of a base pressure-sensitive adhesive material thereof is formed over a given range from a surface of the pressure-sensitive adhesive layer in a thickness direction thereof, whereby: in a lamination process of a customer which is a supply destination of the transparent electroconductive layer-equipped cover element, it becomes possible to eliminate a need to distinguish between obverse and reverse sides of the pressure-sensitive adhesive sheet itself; and, when the transparent electroconductive layer-equipped cover element is bonded to an optical element through the pressure-sensitive adhesive layer, it becomes possible to suppress internal reflection in a laminate formed of these optical elements.

According to one aspect of the present invention, there is provided a transparent electroconductive layer-equipped cover element comprising a cover element and a transparent electroconductive layer and provided with a transparent pressure-sensitive adhesive layer, wherein: the transparent electroconductive layer is provided on an inner side of the cover element in a patterned manner; and the pressure-sensitive adhesive layer comprises a base adhesive zone made essentially of a transparent base pressure-sensitive adhesive material and formed over a given range from one principal surface of the pressure-sensitive adhesive layer in a thickness direction of the pressure-sensitive adhesive layer, and a transparent, adherent, refractive index adjustment zone formed over a given range from the other principal surface of the pressure-sensitive adhesive layer in the thickness direction, wherein the refractive index adjustment zone is in contact with the transparent electroconductive layer and has a refractive index greater than a refractive index of the base pressure-sensitive adhesive material.

Preferably, the refractive index adjustment zone has a thickness of 20 nm to 600 nm. In one embodiment of the present invention, the refractive index adjustment zone may be formed by dispersing, in a pressure-sensitive adhesive material identical to the base pressure-sensitive adhesive material, particles of a high refractive index material having a refractive index greater than that of the pressure-sensitive adhesive material, to thereby increase an average refractive index of the refractive index adjustment zone. In this embodiment, the refractive index of the high refractive index material particles is preferably in the range of 1.60 to 2.74. Preferably, the high refractive index material particles have an average primary particle size of 3 nm to 100 nm as measured by TEM observation. Preferably, the high refractive index material is one or more compounds selected from the group consisting of $TiO_2$, $ZrO_2$, $CeO_2$, $Al_2O_3$, $BaTiO_3$, $Nb_2O_5$ and $SnO_2$.

In another embodiment of the present invention, the other principal surface of the pressure-sensitive adhesive layer defined by the refractive index adjustment zone may be formed such that it has a region on which the high refractive index material particles are partially exposed, and a matrix region on which the base pressure-sensitive adhesive material of the refractive index adjustment zone is partially exposed. In this embodiment, the region on which the high refractive index material particles are exposed is preferably formed in an area ratio of 30 to 99%. Further, a difference between the refractive index of the high refractive index material particles and the refractive index of the base pressure-sensitive adhesive material is preferably in the range of 0.15 to 1.34.

In the present invention, the pressure-sensitive adhesive layer preferably has a total light transmittance of 80% or more. The high refractive index material particles may partially exist in the form of an aggregate arising from aggregation of two or more thereof.

Preferably, the refractive index adjustment zone has a thickness of 20 nm to 600 nm. In one embodiment of the present invention, the refractive index adjustment zone may be formed by dispersing, in a pressure-sensitive adhesive material identical to the base pressure-sensitive adhesive material, particles of a high refractive index material having a refractive index greater than that of the pressure-sensitive adhesive material, to thereby increase an average refractive index of the refractive index adjustment zone. In this embodiment, preferably, the refractive index of the base pressure-sensitive adhesive material is set in the range of 1.40 to 1.55, and the refractive index of the high refractive index material particles is set in the range of 1.60 to 2.74. A bonding surface of the refractive index adjustment zone bonded to an optical element is formed such that it has a region where the high refractive index material particles are in contact with the optical element, and a matrix region where the pressure-sensitive adhesive material of the refractive index adjustment zone is in contact with the optical element. In this case, the region where the high refractive index material particles are in contact with the optical element is preferably formed in an area ratio of 30 to 99%. Further, a difference between the refractive index of the high refractive index material particles and the refractive index of the base pressure-sensitive adhesive material is preferably in the range of 0.15 to 1.34.

In yet another embodiment of the present invention, the refractive index adjustment zone may be formed by adding, to a pressure-sensitive adhesive material identical to the base pressure-sensitive adhesive material, an organic material having a refractive index greater than that of the pressure-sensitive adhesive material, in the form of particle, polymer or oligomer, to thereby increase an average refractive index of the refractive index adjustment zone. In the case where the pressure-sensitive adhesive layer having this feature is applied to a configuration obtained by forming a transparent electroconductive layer on an optical element, the refractive indexes of the transparent electroconductive layer, the base pressure-sensitive adhesive material and the organic material are preferably set, respectively, in the range of 1.75 to 2.14, in the range of 1.40 to 1.55 and in the range of 1.59 to 2.04. Examples of the high refractive index organic material usable herein include, but are not particularly limited to, a resin having an aromatic ring such as a styrene-based resin, and a resin containing a heteroatom such as a sulfur atom or a nitrogen atom (e.g., a polymer containing a thiol or triazine ring). Further, examples of the particles include nanometer-size organic nanoparticles and nanometer-size spherical macromolecules. Preferably, such particles have an average primary particle size of 3 nm to 100 nm as measured by TEM observation.

Preferably, the pressure-sensitive adhesive layer preferably has a total light transmittance of 80% or more. The high refractive index material particles may partially exist in the form of an aggregate arising from aggregation of two or more thereof. In the present invention, the refractive index adjustment zone typically exists with irregular depths in the thickness direction of the pressure-sensitive adhesive layer.

For example, when the pressure-sensitive adhesive sheet relating to the present invention is used to bond a transparent, first optical element to a second optical element having a transparent electroconductive layer constituting a touch sensor or the like, the pressure-sensitive adhesive layer is peeled off from the support, and positionally adjusted such that one surface of the pressure-sensitive adhesive layer defined by the transparent, adherent, refractive index adjustment zone faces the transparent electroconductive layer and the second optical element, and the other surface of the pressure-sensitive adhesive layer faces the first optical element. Then, the other surface of the pressure-sensitive adhesive layer is bonded to the first optical element, and the refractive index adjustment zone is brought into contact with both of the transparent electroconductive layer and the second optical element in such a manner as to fill up a stepped space between the transparent electroconductive layer and the second optical element, whereby reflected light resulting from reflection of external light entering through the first optical element, at an interface between the base adhesive zone and the refractive index adjustment zone, and reflected light resulting from reflection of the external light at an interface between the refractive index adjustment zone and the transparent electroconductive layer, are at least partially cancelled out by means of optical interference.

Thus, when the pressure-sensitive adhesive sheet relating to the present invention is used to suppress such internal reflection, it is possible to at least partially cancel out reflected light resulting from reflection of external light entering through the first optical element, at an interface between a zone made essentially of the base pressure-sensitive adhesive material and the refractive index adjustment zone in the pressure-sensitive adhesive layer, and reflected light resulting from reflection of the external light at an interface between the refractive index adjustment zone and the second optical element, by means of optical interference.

Effect of Invention

In the present invention, the refractive index adjustment zone having a refractive index greater than that of the base pressure-sensitive adhesive material is formed over a given range from the other principal surface of the pressure-sensitive adhesive layer in the thickness direction, so that it becomes possible to form a high refractive index region without causing an increase in haze value. Thus, when the transparent electroconductive layer-equipped cover element using the pressure-sensitive adhesive sheet relating to the present invention is bonded to a second optical element, the refractive index adjustment zone as a high refractive index region can adjust a refractive index difference with respect to the second optical element to thereby suppress reflection at the interface between the pressure-sensitive adhesive layer and the second optical element.

In the configuration where a patterned transparent electroconductive layer is formed on the second optical element, the refractive index of the refractive index adjustment zone of the pressure-sensitive adhesive layer can be adjusted with respect to respective refractive indexes of the transparent electroconductive layer and the second optical element, so as to suppress interface reflection. Further, reflected light returning toward the first optical element can be significantly reduced by a cancel-out effect based on an inter-reflected light phase difference among reflected light by the transparent electroconductive layer, reflected light by the second optical element and reflected light occurring inside the pressure-sensitive adhesive layer.

BRIEF DESCRIPTION OF DRAWINGS

FIG. 1(a) is a sectional view depicting one embodiment of a pressure-sensitive adhesive sheet relating to the present invention.

FIG. 1(b) is a sectional view depicting an optical element laminate presented as one example of a simplest embodiment using a pressure-sensitive adhesive sheet according to the present invention (a simplest example of use of a pressure-sensitive adhesive sheet in FIG. 1(a)).

FIG. 2 is a sectional view depicting one embodiment of a pressure-sensitive adhesive layer for use in the pressure-sensitive adhesive sheet relating to the present invention.

FIG. 6 is a schematic diagram depicting a configuration of a laminate using a transparent electroconductive layer-equipped cover element having a refractive index adjustment zone-formed pressure-sensitive adhesive layered thereon, according one embodiment of the present invention.

FIG. 7(a) is a schematic diagram depicting a configuration of a transparent electroconductive layer-equipped cover element for use in Inventive Examples and Comparative Examples.

FIG. 7(b) is a schematic diagram depicting a configuration of another transparent electroconductive layer-equipped cover element for use in Inventive Examples and Comparative Examples.

FIG. 8(a) depicts a configuration of a refractive index adjustment zone-formed pressure-sensitive adhesive (A1) for use in Inventive Examples and Comparative Examples.

FIG. 8(b) depicts a configuration of another refractive index adjustment zone-formed pressure-sensitive adhesive (B1) for use in Inventive Examples and Comparative Examples.

FIG. 8(c) depicts a configuration of yet another refractive index adjustment zone-formed pressure-sensitive adhesive (C1) for use in Inventive Examples and Comparative Examples.

FIG. 8(d) depicts a configuration of still another refractive index adjustment zone-formed pressure-sensitive adhesive (D1) for use in Inventive Examples and Comparative Examples.

DESCRIPTION OF EMBODIMENTS

Figure 3:
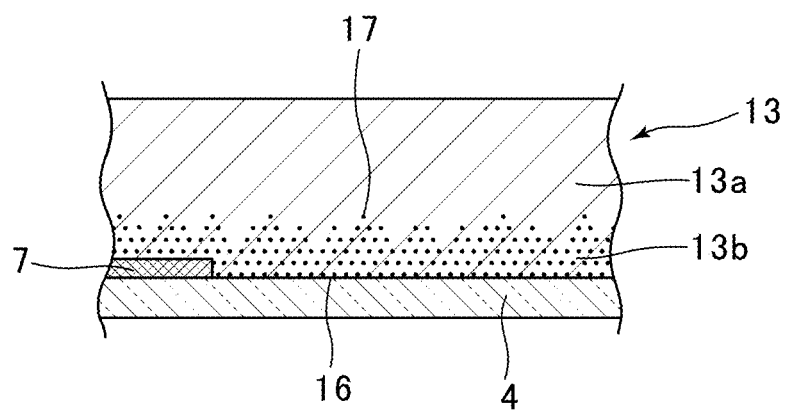
FIG. 3 is a sectional view depicting an embodiment where the pressure-sensitive adhesive layer 13 depicted in FIG. 2 is applied to a configuration in which a patterned transparent electroconductive layer is formed on an optical element.

An embodiment of the present invention will now be described in connection with the figures. FIG. 1(a) is a sectional view depicting one embodiment of a pressure-sensitive adhesive sheet relating to the present invention. FIG. 1(b) is a sectional view depicting an optical element laminate 1 presented as one example of a simplest embodiment using a pressure-sensitive adhesive sheet according to the present invention (a simplest example of use of a pressure-sensitive adhesive sheet in FIG. 1(a)). Referring to FIG. 1(a), a pressure-sensitive adhesive sheet S relating to the present invention comprises: an optically transparent pressure-sensitive adhesive layer 3; a first support S1 composed of a separator laminated to one principal surface of the pressure-sensitive adhesive layer 3; and a second support S2 composed of a separator laminated to the other principal surface of the pressure-sensitive adhesive layer 3. Referring to FIG. 1(b), the optical element laminate 1 comprises an optically transparent, first optical element 2, and a second optical element 4 bonded to the first optical element 2 through an optically transparent pressure-sensitive adhesive layer 3. This pressure-sensitive adhesive layer 3 is obtained by peeling off the supports S1, S2 from the pressure-sensitive adhesive sheet S depicted in FIG. 1(a), wherein the first and second optical elements are laminated to the exposed opposite surfaces of the pressure-sensitive adhesive layer 3. The transparent, first optical element 2 may be composed of an optical film for use in an optical display device, such as a polarizing film or a retardation film, or a transparent cover element for use in an optical display device, such as a viewing-side cover glass. The first optical element 2 and the second optical element 4 are bonded, respectively, to a first principal surface 5 and a second principal surface 6 of the pressure-sensitive adhesive layer 3.

The transparent pressure-sensitive adhesive layer 3 comprises a base adhesive zone 3a made essentially of a base pressure-sensitive adhesive material, and a refractive index adjustment zone 3b having a refractive index greater than that of the base adhesive zone 3a. Preferably, the refractive index of the base pressure-sensitive adhesive material of the base adhesive zone 3a is close to the refractive index of the first optical element 2.

The base pressure-sensitive adhesive material is not particularly limited, as long as it is a transparent adherent material usable in optical applications. For example, it is possible to use one or more appropriately selected from the group consisting of an acrylic-based pressure-sensitive adhesive, a rubber-based pressure-sensitive adhesive, a silicone-based pressure-sensitive adhesive, a polyester-based pressure-sensitive adhesive, a urethane-based pressure-sensitive adhesive, an epoxy-based pressure-sensitive adhesive, and a polyether-based pressure-sensitive adhesive. From a viewpoint of transparency, processability, durability, etc., it is preferable to use an acrylic-based pressure-sensitive adhesive. As the base pressure-sensitive adhesive material, the above pressure-sensitive adhesives may be used independently or in the form of a combination of two or more of them. An acrylic-based polymer to be used as a base polymer of an acrylic-based pressure-sensitive adhesive is preferably, but not particularly limited to, a homopolymer or copolymer of monomers comprising a primary component consisting of (meth)acrylic acid alkyl ester. It should be noted that the term "(meth)acrylic" is used herein to mean either one or both of "acrylic" and "methacrylic", and this definition is also applied to the following description. In this specification, the term "acrylic-based polymer" is used to mean that it may include the above (meth)acrylic acid alkyl ester, and any other monomer copolymerizable with the (meth)acrylic acid alkyl ester. Generally, the refractive index of the base pressure-sensitive adhesive material is in the range of 1.40 to 1.55.

Although a thickness of the pressure-sensitive adhesive layer 3 is not particularly limited, it is set, typically, in the range of 5 µm to 500 µm, preferably, in the range of 5 µm to 350 µm, more preferably, in the range of 5 µm to 250 µm. In the pressure-sensitive adhesive layer 3, a thickness of the refractive index adjustment zone 3b is set, preferably, in the range of 20 nm to 600 nm, more preferably, in the range of 20 nm to 300 nm, furthermore preferably, in the range of 20 nm to 200 nm. A boundary between the refractive index adjustment zone 3b and the base adhesive zone 3a is formed as an irregular undulating curve. In the present invention, the thickness of the refractive index adjustment zone 3b is determined by averaging a plurality of measurement values of a depth of the undulation. A thickness of the base adhesive zone 3a is derived by subtracting the thickness of the refractive index adjustment zone 3b from the thickness of the pressure-sensitive adhesive layer 3. As measured according to JIS K7361, a total light transmittance of the entire pressure-sensitive adhesive layer 3 is 80% or more, preferably, 90% or more. It is preferable to achieve a higher total light transmittance of the pressure-sensitive adhesive layer 3. Further, a haze value of the pressure-sensitive adhesive layer 3 is preferably 1.5% or less, more preferably, 1% or less.

The refractive index adjustment zone 3b can be formed, for example, by applying, by a given amount, a solution of a resin material having a refractive index greater than that of the base pressure-sensitive adhesive material, onto one surface of a pressure-sensitive adhesive layer formed of the base pressure-sensitive adhesive material (this layer will hereinafter be also referred to as "base pressure-sensitive adhesive material layer"), and then subjecting the resulting pressure-sensitive adhesive layer to drying. Examples of the resin material usable for this purpose include a pressure-sensitive adhesive composition described in the Patent Document 1. Alternatively, it is possible to employ a technique of: dispersing, in the form of a solid, an organic material having a refractive index greater than that of the base pressure-sensitive adhesive material, such as styrene oligomer, in a dispersion medium to prepare a dispersion liquid; applying the dispersion liquid to a surface of a base pressure-sensitive adhesive material layer; and subjecting the resulting pressure-sensitive adhesive layer to drying. However, in the present invention, it is preferable to employ a technique of causing particles of a high refractive index material to infiltrate into the base pressure-sensitive adhesive material layer from one surface thereof, whereby the high refractive index material particles are dispersed in a region of the base pressure-sensitive adhesive material layer adjacent to the one surface, as described below in connection with FIG. 2.

With reference to FIG. 2, a configuration of a pressure-sensitive adhesive layer 13 according to one embodiment of the present invention will be described in detail below.

As with the pressure-sensitive adhesive layer 3 in the embodiment depicted in FIG. 1, the pressure-sensitive adhesive layer 13 depicted in FIG. 2 according to one embodiment of the present invention has a first principal surface 15 and a second principal surface 16, and comprises a base adhesive zone 13a made essentially of a base pressure-sensitive adhesive material, and a refractive index adjustment zone 13b having a refractive index greater than that of the base adhesive zone 13a. In this example, the refractive index adjustment zone 13b is formed such that it contains particles 17 of a high refractive index material which are caused to infiltrate into a base pressure-sensitive adhesive material layer from the second principal surface 16, and dispersed in the base pressure-sensitive adhesive material layer, over a given depth in a thickness direction of the base pressure-sensitive adhesive material layer, to thereby have a refractive index greater than that of the base adhesive zone 13a.

Preferably, a refractive index of the high refractive index material particles 17 in the refractive index adjustment zone 13b is in the range of 1.6 to 2.7. Preferably, a difference between the refractive index of the high refractive index material particles and the refractive index of the base pressure-sensitive adhesive material is in the range of 0.2 to 1.3. In the case where the refractive index adjustment zone is formed by impregnating a part of the base pressure-sensitive adhesive material layer with an organic material having a refractive index greater than that of the base pressure-sensitive adhesive material, a difference between the refractive index of the organic material and the refractive index of the base pressure-sensitive adhesive material is preferably set in the range of 0.1 to 0.6. Examples of a high refractive index material usable in this example where high refractive index material particles are used in the refractive index adjustment zone include $TiO_2$, $ZrO_2$, $CeO_2$, $Al_2O_3$, $BaTiO_2$, $Nb_2O_5$ and $SnO_2$, and one or more compounds selected from them can be used to form the high refractive index material particles 17. The high refractive index material particles 17 may be set to have an average primary particle size of 3 nm to 100 nm, and distributed in the refractive index adjustment zone 13b in an individually dispersed state or in a partially aggregated state. As described in connection with FIG. 1, a boundary between the refractive index adjustment zone 13b and the base adhesive zone 13a is formed as an irregular undulating curve. In a thickness measurement for the refractive index adjustment zone 13b, a depth at each of a plurality of measurement positions in a region where 90% of the high refractive index material particles 17 exist is determined as a thickness measurement value, and the measurement values at the plurality of measurement positions are averaged to obtain a thickness of the refractive index adjustment zone 13b.

FIG. 3 is a sectional view depicting an embodiment in which the pressure-sensitive adhesive layer 13 depicted in FIG. 2 is applied to a configuration obtained by forming a patterned transparent electroconductive layer 7 such as a patterned ITO film, on a pressure-sensitive adhesive layer-side surface of the second optical element 4, so as to make up a touch panel sensor. In this case, examples of the second optical element 4 may include a glass substrate of a display panel, for example, in a liquid crystal display device or an organic EL display device.

Figure 4:
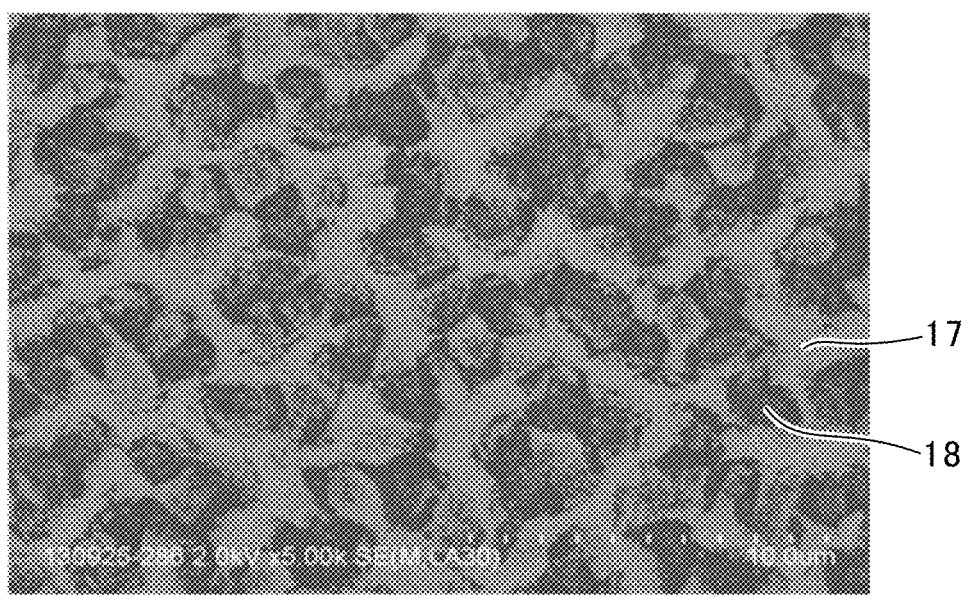
FIG. 4 is a top plan view depicting a state of a principal surface of the pressure-sensitive adhesive layer which is in contact with a second optical element.

As depicted in FIG. 3, the principal surface 16 of the refractive index adjustment zone 13b of the pressure-sensitive adhesive layer 13 is bonded to respective pressure-sensitive adhesive layer-side surfaces of the second optical element 4 and the transparent electroconductive layer 7 in such a manner as to fill up a stepped space between the second optical element 4 and the transparent electroconductive layer 7. FIG. 4 is a top plan view depicting a state of the principal surface 16 of the pressure-sensitive adhesive layer 13 in contact with the second optical element 4. As depicted in FIG. 4, a microstructure of the principal surface 16 is formed in a sea-island structure where the high refractive index material particles 17 are dispersed in a matrix 18 of the base pressure-sensitive adhesive material in the form of islands. In a contact surface of the pressure-sensitive adhesive layer 13 with the second optical element 4, there are a region where the base pressure-sensitive adhesive material is in contact with the second optical element 4 and a region where the high refractive index material particles 17 are in contact with the second optical element 4. Preferably, a ratio of an area of the high refractive index material particles 17 to a total area of the high refractive index material particles 17 and the base pressure-sensitive adhesive material at the above position is set in the range of 30 to 99%.

The area ratio is calculated by measuring an area of the high refractive index material particles 17 in each of a plurality of square regions having a side length of 10 μm to 200 μm to obtain a ratio of the area of the high refractive index material particles 17 to the entire area of the square region, and averaging the area ratios measured in the plurality of square regions.

Figure 5A:
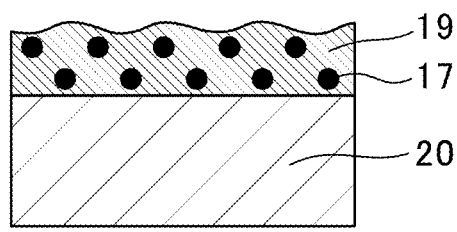
FIG. 5(a) is a schematic diagram illustrating a step of application of a dispersion liquid, in a process for preparing the pressure-sensitive adhesive layer depicted in FIG. 2.
Figure 5B:
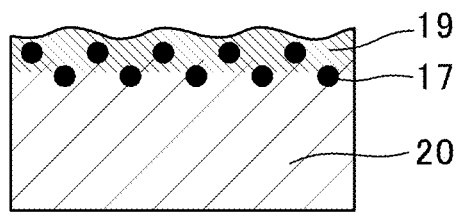
FIG. 5(b) is a schematic diagram illustrating a step of infiltration with high refractive index material particles, in the process for preparing the pressure-sensitive adhesive layer depicted in FIG. 2.
Figure 5C:
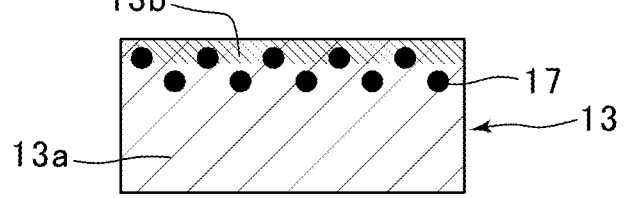
FIG. 5(c) is a schematic diagram illustrating a drying step, in the process for preparing the pressure-sensitive adhesive layer depicted in FIG. 2.

FIGS. 5(a), 5(b) and 5(c) schematically depict a process of producing the pressure-sensitive adhesive layer 13 in FIG. 2. First of all, a dispersion liquid 19 obtained by dispersing the above high refractive index material particles 17 in a dispersion medium, and a base pressure-sensitive adhesive material layer 20, are preliminarily prepared. Then, as depicted in FIG. 5(a), the dispersion liquid 19 is applied to a surface of the base pressure-sensitive adhesive material layer 20. Thus, the surface of the base pressure-sensitive adhesive material layer 20 is swelled by the dispersion medium of the dispersion liquid 19, and, in this process, the high refractive index material particles 17 in the dispersion liquid 19 infiltrate into the base pressure-sensitive adhesive material layer 20 in the thickness direction. This state is depicted in FIG. 5(b). Subsequently, the resulting base pressure-sensitive adhesive material layer 20 is dried to vaporize the dispersion medium of the dispersion liquid 19 to obtain the pressure-sensitive adhesive layer 13 depicted in FIG. 2, i.e., a refractive index adjustment zone-formed pressure-sensitive adhesive layer. This state is depicted in FIG. 5(c).

An infiltration depth of the high refractive index material particles 17 with respect to the base pressure-sensitive adhesive material layer 20 is determined by a relationship between the base pressure-sensitive adhesive material and the dispersion medium of the dispersion liquid 19. The dispersion medium may be appropriately selected to enable the infiltration depth (thickness of the refractive index adjustment zone) to become the aforementioned value.

EXAMPLES

Although the present invention will be further described below, based on examples, it is to be understood that the present invention is not limited to the following examples. In the following description about the examples, part(s) and % are on the basis of weight (by weight), and, unless otherwise stated below, conditions of leaving a sample to stand at room temperature (room temperature standing) are 23° C. and 65% RH in all the cases.

FIG. 6 depicts a laminate 21 using a transparent electroconductive layer-equipped cover element having a reflective index adjustment zone-formed pressure sensitive adhesive layered thereon, according to one embodiment of the present invention. In this embodiment, a surface of a cover sensor 22 as a transparent electroconductive layer-equipped cover element comprises a cover sensor (glass/resin) and a transparent electroconductive layer (ITO), wherein one surface of the reflective index adjustment zone-formed pressure sensitive adhesive (IM sublayer-formed pressure sensitive adhesive 23) defined by a reflective index adjustment zone thereof is attached to one surface of the cover sensor 22 on the side of the transparent electroconductive layer. Then, the other surface of the IM sublayer-formed pressure sensitive adhesive 23 on a side opposite to the reflective index adjustment zone is attached to an image display (LCD, OLED) 24. The IM sublayer-formed pressure sensitive adhesive 23 can be laminated to an image display such as an LCD panel or an OLED panel).

An image display device described below comprises the transparent electroconductive layer-equipped cover element of the present invention. Although the following description will be made by taking a liquid crystal display device as an example, the present invention is also applicable to any type of image display devices requiring a transparent electroconductive layer-equipped cover element. Specific examples of an image display compatible with the transparent electroconductive layer-equipped cover element of the present invention include a liquid crystal display, an electroluminescence (EL) display, a plasma display (PD), and a field emission display (FED). The image display device in the present invention comprises the transparent electroconductive layer-equipped cover element of the present invention, and the remaining configuration is the same as that of a conventional image display device.

A liquid crystal cell drive mode is not particularly limited, but any of various heretofore-known modes may be used. Examples of the drive mode include a twisted nematic (TN) mode, a super twisted nematic (STN) mode, an electrically-controlled birefringence (ECB) mode, a vertical alignment (VA) mode, an in-plane switching (IPS) mode, a fringe field switching (FFS) mode, optically compensated bend (OCB) mode, hybrid-aligned nematic (HAN) mode, a surface-stabilized ferroelectric liquid crystal (SSFLC) mode, and an anti-ferroelectric liquid crystal (AFLC) mode. Among them, from a viewpoint of being capable of minimizing brightness change/color change due to viewing angle, it is preferable to use the in-plane switching (IPS) mode. Further, as necessary, a color filter, a black matrix or the like may be provided on either substrate of a liquid crystal cell.

<Production of Transparent Electroconductive Layer Using Glass Substrate Cover Lens (with Pattern)>

A 20 nm-thick ITO film was formed on one of opposite surfaces of a 0.65 mm-thick alkali-free glass (refractive index: 1.53) by sputtering, to thereby produce a transparent electroconductive substrate having a crystallized ITO film (refractive index: 1.85). An Sn ratio of the crystallized ITO thin film was 3 weight %. After forming a photoresist film on a part of a surface of the transparent electroconductive layer, the resulting film was immersed in an aqueous hydrogen chloride solution (hydrochloric acid concentration: 5 weight %) at 25° C., for 1 minute, to subject the transparent electroconductive layer to etching. Through the etching, a non-removed portion of the transparent electroconductive layer corresponding to an electrode wiring pattern (ITO 27 in FIG. 7(a)), and a removed portion of the transparent electroconductive layer (opening), were formed. This produced cover element will hereinafter be referred to as "cover element (1)". A configuration of the cover element (1) (cover element 25) is depicted in FIG. 7(a). A numerical value described in each layer in FIG. 7(a) denotes a refractive index. Similarly, a numerical value described in each layer in the following figures (FIGS. 7(b) to 10(d)) denotes a refractive index, unless a unit is indicated.

<Production of Transparent Electroconductive Layer Using Film Substrate Cover Lens (with Pattern)>

A coating liquid obtained by adding 0.07 parts of a plurality of 3 μm-diameter particles (trade name: "SSX105", manufactured by Sekisui Jushi Corp.) to 100 parts of binder resin (trade mark "UNIDIC RS29-120", manufactured by DIC Corp.) was applied to each of opposite surfaces of a 100

µm-thick cyclo-olefin polymer film (trade name: "ZEONOA ZF16", manufactured by Nippon Zeon Co., Ltd., in-plane birefringence: 0.0001) by using a bar coater, and dried in an oven at 80° C. for 1 minute. Then, each surface of the resulting film was irradiated with ultraviolet light (high-pressure mercury vapor lamp) with an integrated light intensity of 300 mJ/cm$^2$, thereby forming a film having anti-blocking layers on respective opposite surfaces thereof (this film will hereinafter be referred to as "COP substrate"). Then, a refractive index adjuster (trade name: "OPSTAR KZ6661", manufactured by JSR Corp.) was applied to one surface of the COP substrate by using a bar coater, and, after being dried in an oven at 80° C. for 1 minute, irradiated with ultraviolet light (high-pressure mercury vapor lamp) with an integrated light intensity of 300 mJ/cm$^2$, so that it was formed as a 100 nm-thick refractive index adjustment layer having a refractive index of 1.65. Then, a 23 nm-thick indium tin oxide (ITO) layer serving as a transparent electroconductive layer was deposited on the surface of the refractive index adjustment layer of the COP substrate, by using a winding type sputtering apparatus. After forming a photoresist film on a part of a surface of the transparent electroconductive layer, the resulting film was immersed in an aqueous hydrogen chloride solution (hydrochloric acid concentration: 5 weight %) at 25° C., for 1 minute, to subject the transparent electroconductive layer to etching. Through the etching, a non-removed portion of the transparent electroconductive layer corresponding to an electrode wiring pattern (ITO 31 in FIG. 7(b)), and a removed portion of the transparent electroconductive layer (opening), were formed. This produced cover element will hereinafter be referred to as "cover element (2)". A configuration of the cover element (2) (cover element 28) is depicted in FIG. 7(b).

The transparent electroconductive layer is preferably made of a material having transparency (invisibility) in addition to electroconductive property, and capable of being patterned A material forming the transparent electroconductive layer is not particularly limited, and it is possible to use a metal oxide of at least one metal selected from the group consisting of indium, tin, zinc, gallium, antimony, titanium, silicon, zirconium, magnesium, aluminum, gold, silver, copper, palladium and tungsten. The metal oxide may further contain a metal atom presented in the above group as necessary. For example, it is preferable to use indium oxide (ITO) containing tin oxide, tin oxide containing antimony, or the like. Among them, ITO is particularly preferable. The metal oxide may further contain a metal atom presented in the above group as necessary. For the transparent electroconductive layer, any of various shapes such as a comb-like shape, a stripe shape and a diamond shape may be employed depending on the intended use. For example, it is preferable to use indium oxide (ITO) containing tin oxide, tin oxide containing antimony, or the like. Among them, ITO is particularly preferable. The ITO may be crystalline ITO or may be amorphous ITO. For example, the crystalline ITO can be obtained by subjecting ITO to sputtering under high temperatures or by further heating the amorphous ITO. Preferably, ITO contains 80 to 99 weight % of indium oxide and 1 to 20 weight % of tin oxide.

Although a thickness of the transparent electroconductive layer is not particularly limited, it is preferably set to 7 nm or more, more preferably, 12 to 200 nm, furthermore preferably, 12 to 100 nm, particularly preferably, 18 to 70 nm. If the thickness of the transparent electroconductive layer is less than 7 nm, the transparent electroconductive layer is not evenly attached in plane, so that it is likely that a resistance value in plane becomes unstable, or a desired resistance value fails to be obtained. On the other hand, if the thickness of the transparent electroconductive layer is greater than 200 nm, the transparent electroconductive layer tends to undergo deterioration in productivity, increase in cost, and deterioration in optical properties.

A method for forming the transparent electroconductive layer is not particularly limited, but any of various heretofore-known processes may be employed. Specific examples thereof may include vacuum vapor deposition, sputtering, and ion plating. Among them, an appropriate process may be selectively employed according to a required thickness.

Between the electroconductive layer and the cover element or between the electroconductive layer and the pressure-sensitive adhesive, an undercoat layer or an overcoat layer may be provided. The coat layer may be formed in a single-layer structure or a two or more-layer, i.e., multilayer, structure. The coat layer may have a refractive index adjustment function. Preferably, the coat layer has a refractive index equal to or less than that of the electroconductive layer. The coat layer may additionally have a gas barrier function and/or an anti-rust function.

The transparent electroconductive layer may comprise a metal nanowire or a metal mesh. The metal nanowire means an electroconductive substance which is made of a metal and formed in a needle-like or thread-like shape having a nanometer size in diameter. The metal nanowire may be linear or may be curved. When a transparent electroconductive layer composed of metal nanowires is used, the metal nanowires are formed into a mesh shape. Thus, even in the case where an amount of metal nanowires is relatively small, it is possible to form a good electrical conduction path and obtain a transparent electroconductive film having a relatively small electrical resistance. Further, the metal nanowires are formed into a mesh shape, so that openings are formed between mesh intervals. This makes it possible to obtain a transparent electroconductive film having a high light transmittance.

Any appropriate metal may be used as a metal forming the metal nanowire, as long as the metal has high electroconductivity. Examples of the metal forming the metal nanowire include silver, gold, copper, and nickel. Further, it is possible to use a material obtained by subjecting each of the metals to plating (such as gold plating). Among them, from a viewpoint of electroconductivity, silver, copper, or gold is preferable, and silver is more preferable.

The transparent electroconductive layer containing a metal mesh is obtained by forming a thin metal wire into a lattice pattern, on the aforementioned substrate laminate. The metal mesh may be made of the same metal as that forming the aforementioned metal nanowire. The transparent electroconductive layer containing the metal mesh can be formed by any appropriate method. For example, the transparent electroconductive layer can be obtained by applying a photosensitive composition (composition for forming a transparent electroconductive layer) containing a silver salt onto the substrate laminate, and then subjecting the resulting substrate laminate to light exposure and developing to form the thin metal wire into a given pattern.

The cover element is passed through a production process such as formation of a wiring pattern and a black matrix, a crystallization treatment and others. Thus, the cover element needs to have excellent heat resistance and chemical resistance. The cover element may be formed, for example, of a glass material or a transparent resin substrate, and may be formed in a single-layer structure or a composite structure composed of a number of members. The thickness of the cover element may be in the range of 0.05 to 2.00 mm, preferably, 0.1 to 1.3 mm, particularly preferably, 0.2 to 1.1 mm. In case of using a glass material having a thickness of 0.2 mm or less, it is possible to obtain a substrate having excellent bendability, but there is a risk of development of a crack and breakage. Thus, in order to prevent the risk, it is preferable to provide a resin layer on one or each of opposite sides of the glass material. The substrate may be partly or entirely formed in a curved or rounded shape.

In the case where the cover element is formed of a glass material, it is possible to select a glass plate having excellent strength and transmittance, such as soda glass, alkali-free glass, borosilicate glass or aluminosilicate glass. When a glass plate having excellent strength is selected, it can be thinned. In particular, chemically toughened glass (aluminosilicate, soda lime) is preferably used from a viewpoint of excellent compressive strength.

Examples of a raw material usable for the transparent resin substrate include: polyester-based resin, such as PET or PEN; cyclo-olefin based resin, such as COP or COC; polyolefin based resin, such as PE, PP, polystyrene or EVA; vinyl-based resin; polycarbonate-based resin; urethane-based resin; polyamide-based resin; polyimide-based resin; acrylic-based resin; epoxy-based resin; polyarylate-based resin; polysulfone-based resin; silsesquioxane-based resin; and triacetylcellulose (TAC). In order to avoid the occurrence of coloration and color unevenness due to retardation, an optically isotropic substrate is preferable. Examples of a recommended substrate for the optically isotropic substrate include cyclo-olefin based resin, polycarbonate-based resin and polyarylate-based resin.

The cover element may have a functional film on an outer side (viewing side) thereof as viewed from the image display. Examples of the functional layer include a hard coat (HC) layer, an anti-reflection layer, an anti-fouling layer, an anti-static layer, and a treated layer for the purpose of diffusion or anti-glare. The functional layer may be formed by arbitrarily combining two or more of them. Further, an ultraviolet absorbing function may be given to the cover element and/or the functional layer.

A shatterproof protective film may be laminated to the outer or inner side of the cover element. The shatterproof film may have the above one or more functional layers. In order to avoid the occurrence of coloration and color unevenness due to retardation, it is preferable to use an optically isotropic substrate (e.g., a non-stretched cyclo-olefin polymer film, or a polycarbonate film based on a casting process). Further, at an arbitrary position between the cover element and the image display, a retardation film (214 wavelength plate) for coping with sunglasses may be disposed. Preferably, the retardation film (214 wavelength plate) is disposed such that a slow axis thereof is at 45 degrees with respect to an absorption axis of a viewing-side polarizing plate of the image display.

The cover element may be provided with a decorative layer. The decorative layer is formed using by colored ink containing a resin binder, and pigment or dye as a colorant. The decorative layer may be formed in a single- or multi-layer structure by means of screen printing, offset printing, gravure printing or the like, and a thickness of the printed layer is generally set in the range of about 0.5 to 50 μm. Further, in order to express metal luster, a layer composed of a metal thin film formed by vapor deposition or sputtering. The decorative layer may be any one of the opposite surfaces of the cover element, or may be formed on a film such as the aforementioned shatterproof film.

[Production of Base Pressure-Sensitive Adhesive Materials]
<Production of Acrylic Oligomer>

60 weight parts of dicyclopentanyl methacrylate (DCPMA), 40 weight parts of methyl methacrylate (MMA), 3.5 weight parts of α-thioglycerol as a chain transfer agent, and 100 weight parts of toluene as a polymerization medium were put into a four-neck flask, and stirred in a nitrogen atmosphere at 70° C. for 1 hour. Then, 0.2 weight parts of 2,2'-azobisisobutyronitrile as a polymerization initiator was put into the four-neck flask to induce a reaction at 70° C. for 2 hours, followed by a further reaction at 80° C. for 2 hours. Then, the resulting reaction solution was placed in an atmosphere at 130° C. to remove the toluene, the chain transfer agent and unreacted monomers therefrom by drying to thereby obtain an acrylic-based polymer in a solid form. The acrylic-based polymer obtained in this manner was named as "acrylic-based polymer (A-1)". This acrylic-based polymer (A-1) had a weight-average molecular weight (Mw) of $5.1 \times 10^3$.

<Production of Base Pressure-Sensitive Adhesive Material A>

0.035 weight parts of a photopolymerization initiator (trade name: "IRGACURE 184", manufactured by BASF SE.) and 0.035 weight parts of a photopolymerization initiator (trade name "IRGACURE 651" manufactured by BASF SE.) were added to a monomer mixture of 68 weight parts of 2-ethylhexyl acrylate (2EHA), 14.5 weight parts of N-vinyl-2-pyrrolidone (NVP) and 17.5 weight parts of 2-hydroxyethyl acrylate (HEA), and then the resulting monomer mixture was exposed to ultraviolet light in a nitrogen atmosphere in such a manner as to be partially photopolymerized, thereby obtaining a partially polymerized product having a polymerization rate of about 10 weight % (acrylic-based polymer syrup).

Then, 5 weight parts of the acrylic-based polymer (A-1), 0.15 weight parts of hexanediol diacrylate (HDDA) and 0.3 weight parts of a silane coupling agent (trade name: "KBM-403", manufactured by Shin-Etsu Chemical Co., Ltd.) were added to and uniformly mixed with the acrylic-based polymer syrup obtained in the above manner to obtain an acrylic-based pressure-sensitive adhesive composition. The acrylic-based pressure-sensitive adhesive composition was applied onto a release-treated surface of a separator film (trade name: "DIAFOIL MRF#38", manufactured by Mitsubishi Plastics, Inc.) in such a manner that a thickness thereof after being formed as a base pressure-sensitive adhesive material layer becomes 200 μm, thereby forming a pressure-sensitive adhesive composition layer. Then, a separator film (trade name: "DIAFOIL MRF#38", manufactured by Mitsubishi Plastics, Inc.) was attached onto a surface of the pressure-sensitive adhesive composition layer in such a manner that a release-treated surface of this separator film faces the applied layer. In this way, the applied layer of the monomeric components is blocked from oxygen. Subsequently, the pressure-sensitive adhesive composition layer was photocured by irradiation with ultraviolet light under conditions including an illuminance of 5 mW/cm$^2$ and a light intensity of 1,500 mJ/cm$^2$, to form a layer of a base pressure-sensitive adhesive martial A.

<Production of Base Pressure-Sensitive Adhesive Material Ba>

28.5 weight parts of 2-ethylhexyl acrylate (2EHA), 28.5 weight parts of isostearyl acrylate (ISTA), 22 weight parts of isobornyl acrylate, 20 weight parts of 4-hydroxybutyl acrylate (4HBA), and two types of photopolymerization initiators: 0.05 weight parts of a photopolymerization initiator (trade name—"IRGACURE 184", manufactured by BASF SE.) and 0.05 weight parts of a photopolymerization initiator (trade name—"IRGACURE 651", manufactured by BASF)

were mixed together, and the resulting monomer mixture was exposed to ultraviolet light in a nitrogen atmosphere in such a manner as to be partially photopolymerized, thereby obtaining a partially polymerized product (acrylic-based polymer syrup) having a polymerization rate of about 10 weight %.

Then, 0.3 weight parts of hexanediol diacrylate (HDDA) and 0.3 weight parts of a silane coupling agent (trade name—"KBM-403", manufactured by Shin-Etsu Chemical Co., Ltd.) were added to and evenly mixed with the acrylic-based polymer syrup obtained in the above manner to obtain an acrylic-based pressure-sensitive adhesive composition. The acrylic-based pressure-sensitive adhesive composition was applied onto a release-treated surface of a separator film (trade name—"DIAFOIL MRF#38", manufactured by Mitsubishi Plastics, Inc.) in such a manner that a thickness thereof after being formed as a base pressure-sensitive adhesive material layer becomes 175 µm, thereby forming a pressure-sensitive adhesive composition layer. Then, a separator film (trade name: "DIAFOIL MRF#38", manufactured by Mitsubishi Plastics, Inc.) was attached onto a surface of the pressure-sensitive adhesive composition layer in such a manner that a release-treated surface of this separator film faces the applied layer. In this way, the applied layer of the monomer components is blocked from oxygen. Subsequently, the pressure-sensitive adhesive composition layer was photocured by irradiation with ultraviolet light under conditions including an illuminance of 5 mW/cm$^2$ and a light intensity of 1,500 mJ/cm$^2$, to form a layer of a base pressure-sensitive adhesive material Ba.

<Production of Base Pressure-Sensitive Adhesive Material Bb>

A base pressure-sensitive adhesive material Bb was produced in the same manner as that for the base pressure-sensitive adhesive material Ba, except that a thickness thereof after being formed as a base pressure-sensitive adhesive material layer was set to 25 µm.

<Production of Base Pressure-Sensitive Adhesive Material C>

32 weight parts of 2-ethylhexyl acrylate (2EHA), 48 weight parts of isostearyl acrylate (ISTA), 20 weight parts of 2-hydroxypropyl acrylate (2HPA), and two types of photopolymerization initiators: 0.05 weight parts of a photopolymerization initiator (trade name—"IRGACURE 184", manufactured by BASF SE.) and 0.05 weight parts of a photopolymerization initiator (trade name—"IRGACURE 651", manufactured by BASF) were put into a four-neck flask to prepare a monomer mixture. Then, this monomer mixture was exposed to ultraviolet light in a nitrogen atmosphere in such a manner as to be partially photopolymerized, thereby obtaining a partially polymerized product (acrylic-based polymer syrup) having a polymerization rate of about 10 weight %. 0.02 weight parts of trimethylolpropane triacrylate (TMPTA) and 0.3 weight parts of a silane coupling agent (trade name—"KBM-403", manufactured by Shin-Etsu Chemical Co., Ltd.) were added to 100 weight parts of the acrylic-based polymer syrup obtained in the above manner, and uniformly mixed together, thereby obtaining an acrylic-based pressure-sensitive adhesive composition. The acrylic-based pressure-sensitive adhesive composition was applied onto a release-treated surface of a separator film (trade name: "DIAFOIL MRF#38", manufactured by Mitsubishi Plastics, Inc.) in such a manner that a thickness thereof after being formed as a base pressure-sensitive adhesive material layer becomes 200 µm, thereby forming a pressure-sensitive adhesive composition layer. Then, a separator film (trade name: "DIAFOIL MRF#38", manufactured by Mitsubishi Plastics, Inc.) was attached onto a surface of the pressure-sensitive adhesive composition layer in such a manner that a release-treated surface of the separator film faces the applied layer. In this way, the applied layer of the monomer component is blocked from oxygen. Subsequently, the pressure-sensitive adhesive composition layer was irradiated with ultraviolet light in such a manner as to be photocured, under conditions including illuminance: 5 mW/cm$^2$, and light intensity: 1,500 mJ/cm$^2$, thereby forming a layer of a base pressure-sensitive adhesive material C.

<Production of Base Pressure-Sensitive Adhesive Material D>

63 weight parts of 2-ethylhexyl acrylate (2EHA), 15 weight parts of N-vinyl-2-pyrrolidone (NVP), 9 weight parts of methyl methacrylate (MMA) and 13 weight parts of hydroxyethyl acrylate (HEA) each serving as a monomer component were put into a separable flask equipped with a thermometer, a stirring device, a reflux cooling tube and a nitrogen introducing tube, and 200 weight parts of ethyl acetate serving as a polymerization medium was further put into the separable flask. The resulting mixture was stirred for 1 hour, under introduction of nitrogen gas. In this way, oxygen in a polymerizing system was removed. Then, 0.2 weight parts of 2,2'-azobisisobutyronitrile as a polymerization initiator was added, and the resulting mixture was heated to 60° C. to induce a reaction for 10 hours. Then, toluene was added to obtain an acrylic-based polymer solution having a solid content concentration of 30 weight %. The obtained acrylic-based polymer solution had a weight-average molecular weight (Mw) of 800,000. 1.0 parts of trimethylolpropane-xylylene diisocyanate ("Takenate D110N" manufactured by Mitsui Chemicals, Inc.) serving as an isocyanate-based cross-linking agent, and 0.2 parts of a silane coupling agent ("KBM-403" produced by Shin-Etsu Chemical Co., Ltd.) were added to the above acrylic-based polymer solution (solid content: 100 parts) to prepare a pressure-sensitive adhesive composition (solution). The pressure-sensitive adhesive solution prepared in the above manner was applied onto a release-treated surface of a separator film (trade name: "DIAFOIL MRF#75", manufactured by Mitsubishi Plastics, Inc.) in such a manner that a thickness thereof after being formed as a base pressure-sensitive adhesive material layer becomes 100 µm. Then, the applied solution was heated and dried under normal pressures at 60° C. for 3 minutes and further at 155° C. for 4 minutes, and the dried layer was subjected to aging at 50° C. for 72 hours to produce a layer of a base pressure-sensitive adhesive material D.

The base pressure-sensitive adhesive material needs to be excellent in optical transparency, adhesiveness, and cohesive property (processability). As the base pressure-sensitive adhesive material, it is possible to use one or more appropriately selected from the group consisting of an acrylic-based pressure-sensitive adhesive, a rubber-based pressure-sensitive adhesive, a silicone-based pressure-sensitive adhesive, a polyester-based pressure-sensitive adhesive, an urethane-based pressure-sensitive adhesive, an epoxy-based pressure-sensitive adhesive, and a polyether-based pressure-sensitive adhesive. Although the thickness of the base pressure-sensitive adhesive material layer is not particularly limited, it is set typically in the range of 5 to 500 µm, preferably in the range of 10 to 350 µm, more preferably in the range of 25 to 250 µm.

Various additives may be added to the base pressure-sensitive adhesive composition for use in the present invention. For example, it is preferable to add any of various silane coupling agents so as to improve adhesion under high-temperature and high-humidity conditions. It is also preferable to add a cross-linking agent to impart a cohesion force associated with durability of a pressure-sensitive adhesive. Further, it is possible to use, as needed basis, viscosity modifier, release regulator, tackifier, plasticizer, softener, filler composed of an inorganic powder or the like, colorant (pigment, dye, etc.), pH adjuster (acid or base), antioxidant, rust inhibitor, and ultraviolet absorber.

A sheet-shaped pressure-sensitive adhesive (base pressure-sensitive adhesive material layer) may be formed by, but not particularly limited to, a technique of applying the base pressure-sensitive adhesive composition onto any of various substrates (a separator film, a transparent resin film, etc.), and drying the applied base pressure-sensitive adhesive composition by a dryer such as a thermal oven, to vaporize a solvent or the like; a technique of subjecting an active energy ray-curable composition applied on any of various substrates to curing such as ultraviolet irradiation; or a technique of subjecting a thermally curable resin composition applied on any of various substrates to thermal curing.

Alternatively, the base pressure-sensitive adhesive material layer may be formed by a technique of applying an active energy ray-curable composition directly onto a transparent electroconductive layer formed on a cover element in a given pattern (α sensor) and subjecting the applied composition to curing such as ultraviolet irradiation; or a technique of subjecting a thermally curable resin composition applied directly onto the transparent electroconductive layer to thermal curing.

[Production of Refractive Index Adjustment Zone-Formed Pressure-Sensitive Adhesives]

<Case of Using Base Pressure-Sensitive Adhesive Material a & High Refractive Index Material Nanoparticle Dispersion Liquid>

(Case of Using Base Pressure-Sensitive Adhesive Material a & Nanoparticle Dispersion Liquid)

A 200 μm-thick base pressure-sensitive adhesive material layer A (refractive index: 1.49) having opposite surfaces each protected by a PET separator sheet was prepared, and one of the PET separator sheets was peeled off. A coating liquid (dispersion medium: ethanol, particle concentration: 1.2 weight %, transmittance of dispersion liquid: 82%; manufactured by CIK Nanotech Co., Ltd.) containing zirconia particles ($ZrO_2$, refractive index: 2.17, average primary particle size: 20 nm), as a dispersion liquid containing high refractive index material particles, was applied to the exposed surface of the base pressure-sensitive adhesive material layer by using a bar coater RDS No. 5 in such a manner as to form a refractive index adjustment zone having a thickness of 20 nm to 200 nm, and dried in a drying oven at 110° C. for 180 seconds. Then, a PET separator sheet (75 μm) serving as a support (backing) was attached onto a surface of the resulting pressure-sensitive adhesive layer, from which the zirconia ($ZrO_2$) particles were dispersed, to thereby obtain a refractive index adjustment zone-formed pressure-sensitive adhesive (A1). An average primary particle size of the zirconia particles was measured by TEM observation. FIG. 8(a) depicts a configuration of the refractive index adjustment zone-formed pressure-sensitive adhesive (A1).

Other Examples

Using the following base pressure-sensitive adhesive material layers and high refractive index material nanoparticle dispersion liquid, refractive index adjustment zone-formed pressure-sensitive adhesives (B1), (C1) and (D1) were produced in the same manner as that in the above case. The materials used were the base pressure-sensitive adhesive material Ba (refractive index: 1.48), the base pressure-sensitive adhesive material C (refractive index: 1.48), the base pressure-sensitive adhesive material D (refractive index: 1.49), and $ZrO_2$ nanoparticle dispersion liquid (dispersion medium: ethanol, particle size: 20 nm). FIGS. 8(b), 8(c) and 8(d) depict, respectively, refractive index adjustment zone-formed pressure-sensitive adhesives (B1), (C1) and (D1).

A list of properties of pressure-sensitive adhesives used in evaluations is presented in the following Table.

TABLE 1

| Refractive Index Adjustment Zone-Formed Pressure-Sensitive Adhesive | Base Pressure-Sensitive Adhesive Material | | High Refractive Index Material | Production Method | Properties of Refractive Index Adjustment Zone in Laminate | | | | |
|---|---|---|---|---|---|---|---|---|---|
| | | | | | Average Interfacial Refractive Index $n_D$ | Thickness of High Refractive Index Layer in cross-sectional TEM observation [nm] | Total Light Transmittance | Haze Value | Adhesive Force at Surface of Refractive Index Adjustment Zone [N/25 mm] |
| | Type | Thickness μm | | | | | | | |
| Refractive index adjustment zone-formed pressure-sensitive adhesive (A1) | (A) Refractive index: 1.49 | 200 | Zirconium oxide (average particle size 20 nm) | Applying and drying ethanol dispersion liquid (solid content: 1.2 wt %, transmittance of dispersion liquid: 82%) to form a rlective index adjustment zone having a thickness of 20 to 200 nm | 1.66 | 140 | 92.3 | 0.6 | 15 |
| Refractive index adjustment zone-formed pressure-sensitive adhesive (B1) | (Ba) Refractive index: 1.48 | 155 | Zirconium oxide (average particle size 20 nm) | Applying and drying ethanol dispersion liquid (solid content: 1.2 wt %, transmittance of dispersion liquid: 82%) to form a rlective index adjustment zone having a thickness of 20 | 1.75 | 120 | 92.3 | 0.4 | 13 |

TABLE 1-continued

| Refractive Index Adjustment Zone-Formed Pressure-Sensitive Adhesive | Base Pressure-Sensitive Adhesive Material | | High Refractive Index Material | Production Method | Properties of Refractive Index Adjustment Zone in Laminate | | | | Adhesive Force at Surface of Refractive Index Adjustment Zone [N/25 mm] |
|---|---|---|---|---|---|---|---|---|---|
| | Type | Thickness μm | | | Average Interfacial Refractive Index $n_D$ | of High Refractive Index Layer in cross-sectional TEM observation [nm] | Total Light Trans-mittance | Haze Value | |
| Refractive index adjustment zone-formed pressure-sensitive adhesive (C1) | C) Refractive index: 1.48 | 200 | Zirconium oxide (average particle size 20 nm) | Applying and drying ethanol dispersion liquid (solid content: 1.2 wt %, transmittance of dispersion liquid: 82%) to form a rlective index adjustment zone having a thickness of 20 to 200 nm | 1.73 | 130 | 92.3 | 0.6 | 16 |
| Refractive index adjustment zone-formed Pressure-sensitive adhesive (D1) | D) Refractive index: 1.49 | 100 | Zirconium oxide (average particle size 20 nm) | Applying and drying ethanol dispersion liquid (solid content: 1.2 wt %, transmittance of dispersion liquid: 82%) to form a rlective index adjustment zone having a thickness of 20 to 200 nm | 1.63 | 220 | 92.3 | 0.6 | 11 |

The refractive index adjustment zone is made of a suitable one selected from a plurality of materials each having a refractive index greater than a refractive index of the base pressure-sensitive adhesive material. From a viewpoint of compatibility with the base pressure-sensitive adhesive material (bleed-out under low temperatures, risk of segregation under high temperatures) and durability under high temperatures, it is preferable to use an inorganic high refractive index material. It is possible to use one or more compounds selected from the group consisting of $TiO_2$, $ZrO_2$, $CeO_2$, $Al_2O_3$, $BaTiO_2$, $Nb_2O_5$ and $SnO_2$. Preferably, the high refractive index material particles have an average primary particle size of 3 nm to 100 nm. The thickness of the refractive index adjustment zone is preferably in the range of 20 nm to 600 nm, more preferably, in the range of 20 nm to 300 nm, furthermore preferably, in the range of 20 nm to 200 nm.

<Production of Laminate of Substrate Cover Lens and Pressure-Sensitive Adhesive

Inventive Examples and Comparative Examples

Inventive Example 1

Figure 9A:
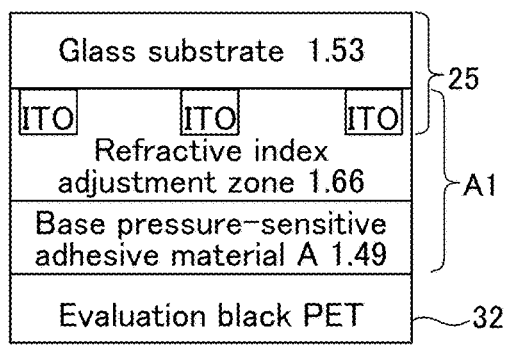
FIG. 9(a) depicts a configuration of an optical element laminate in Inventive Example 1.

An optical element laminate depicted in FIG. 9(a) was produced. Specifically, a transparent electroconductive layer-equipped cover laminate (A) was produced by: peeling off the PET separator sheet on one surface of the refractive index adjustment zone-formed pressure-sensitive adhesive (A1) defined by the refractive index adjustment zone thereof; and attaching the exposed surface to the transparent electroconductive layer of the transparent electroconductive layer-equipped cover element (1) (cover element 25) in such a manner as to bring the refractive index adjustment zone (high refractive index material particle-containing zone) into contact with the transparent electroconductive layer. Further, for reflectance measurement, an evaluation black PET film 32 was attached to the other surface of the refractive index adjustment zone-formed pressure-sensitive adhesive (A1) on a side opposite to the refractive index adjustment zone (high refractive index material particle-containing zone).

Inventive Example 2

Figure 9B:
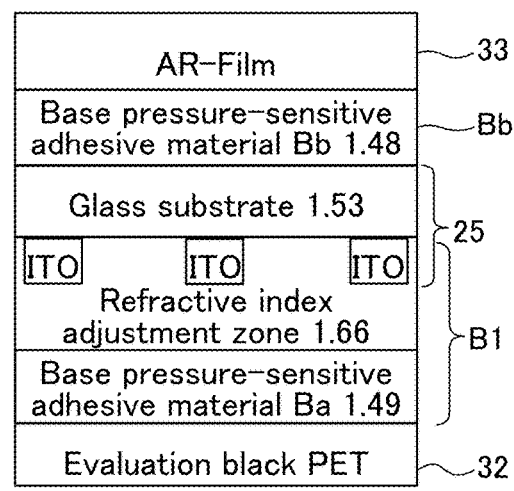
FIG. 9(b) depicts a configuration of an optical element laminate in Inventive Example 2.

An optical element laminate depicted in FIG. 9(b) was produced. In this case, a pressure-sensitive adhesive to be laminated was changed to the refractive index adjustment zone-formed pressure-sensitive adhesive (B1). Specifically, a transparent electroconductive layer-equipped cover laminate (B) was produced by: peeling off the PET separator sheet on one surface of the refractive index adjustment zone-formed pressure-sensitive adhesive (B1) defined by the refractive index adjustment zone thereof; attaching the exposed surface to the transparent electroconductive layer of the transparent electroconductive layer-equipped cover element (1) (cover element 25) in such a manner as to bring the refractive index adjustment zone (high refractive index material particle-containing zone) into contact with the transparent electroconductive layer; and then laminating a triacetylcellulose (TAC) film (AR-Film 33) having a 43 μm-thick anti-reflection layer to a glass surface of the cover element (1) on a side opposite to an electrode surface thereof through the base pressure-sensitive adhesive material (Ba).

Inventive Example 3

Figure 9C:
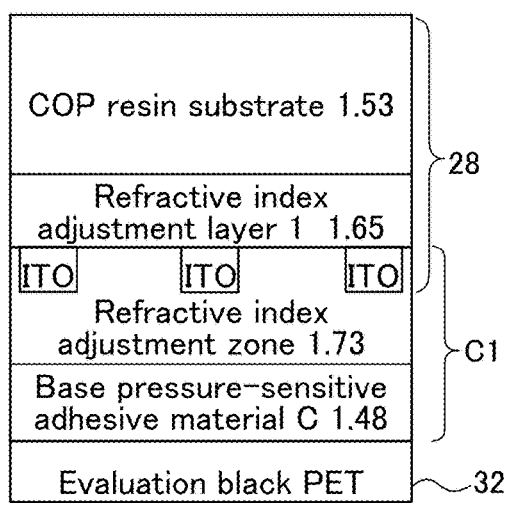
FIG. 9(c) depicts a configuration of an optical element laminate in Inventive Example 3.

An optical element laminate depicted in FIG. 9(c) was produced. In this case, a pressure-sensitive adhesive to be laminated was changed to the refractive index adjustment zone-formed pressure-sensitive adhesive (C1). Specifically, a transparent electroconductive layer-equipped cover laminate (C) was produced by: peeling off the PET separator sheet on one surface of the refractive index adjustment zone-formed pressure-sensitive adhesive (C1) defined by the refractive index adjustment zone thereof; and attaching the exposed surface to the transparent electroconductive layer of the transparent electroconductive layer-equipped cover element (2) (cover element 28) in such a manner as to bring the refractive index adjustment zone (high refractive index material particle-containing zone) into contact with the transparent electroconductive layer. Further, for reflectance measurement, an evaluation black PET film 32 was attached to the other surface of the refractive index adjustment zone-formed pressure-sensitive adhesive (C1) on a side opposite to the refractive index adjustment zone (high refractive index material particle-containing zone).

Inventive Example 4

Figure 9D:
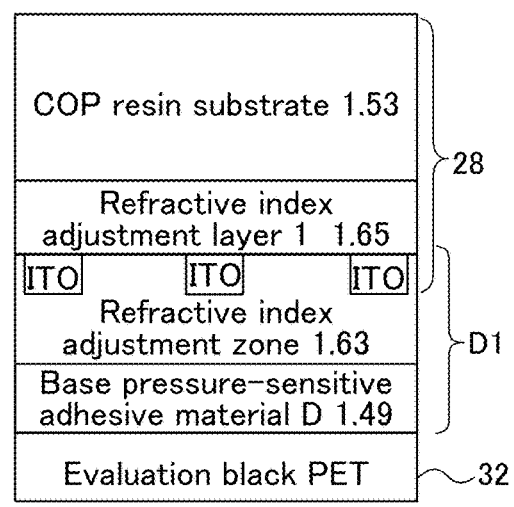
FIG. 9(d) depicts a configuration of an optical element laminate in Inventive Example 4.

An optical element laminate depicted in FIG. 9(d) was produced. Specifically, except that a pressure-sensitive adhesive to be laminated was changed to the refractive index adjustment zone-formed pressure-sensitive adhesive (D1), a transparent electroconductive layer-equipped cover laminate (D) was produced in the same manner as that in Inventive Example 3.

Comparative Example 1

Figure 10A:
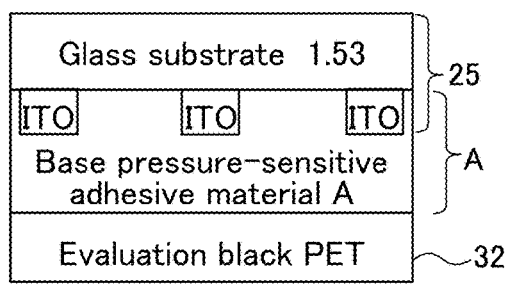
FIG. 10(a) depicts a configuration of an optical element laminate in Comparative Example 1.

An optical element laminate depicted in FIG. 10(a) was produced. Specifically, except that the refractive index adjustment zone-formed pressure-sensitive adhesive (A1) to be laminated was changed to the base pressure-sensitive adhesive material A devoid of the refractive index adjustment zone, a transparent electroconductive layer-equipped cover laminate (E) was produced in the same manner as that in Inventive Example 1.

Comparative Example 2

Figure 10B:
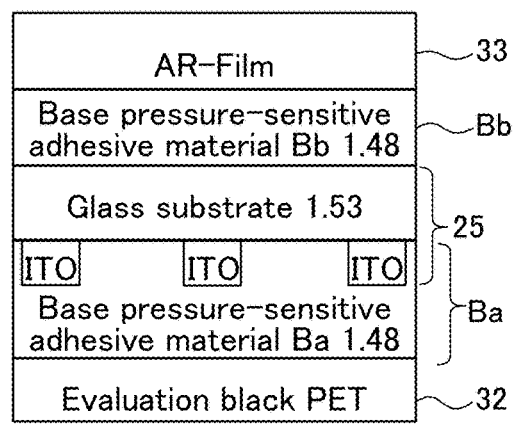
FIG. 10(b) depicts a configuration of an optical element laminate in Comparative Example 2.

An optical element laminate depicted in FIG. 10(b) was produced. Specifically, except that the refractive index adjustment zone-formed pressure-sensitive adhesive (B1) to be laminated was changed to the base pressure-sensitive adhesive material Ba devoid of the refractive index adjustment zone, a transparent electroconductive layer-equipped cover laminate (F) was produced in the same manner as that in Inventive Example 2.

Comparative Example 3

Figure 10C:
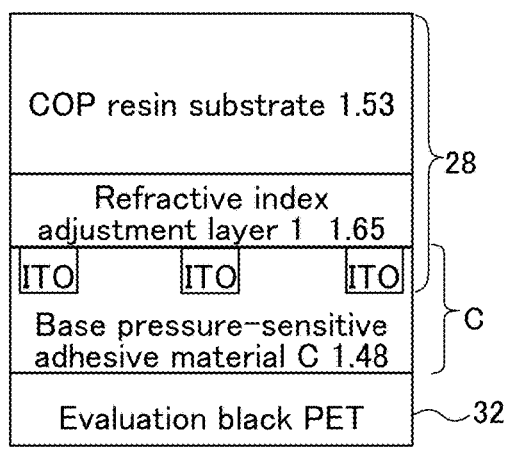
FIG. 10(c) depicts a configuration of an optical element laminate in Comparative Example 3.

An optical element laminate depicted in FIG. 10(c) was produced. Specifically, except that the refractive index adjustment zone-formed pressure-sensitive adhesive (C1) to be laminated was changed to the base pressure-sensitive adhesive material C devoid of the refractive index adjustment zone, a transparent electroconductive layer-equipped cover laminate (G) was produced in the same manner as that in Inventive Example 3.

Comparative Example 4

Figure 10D:
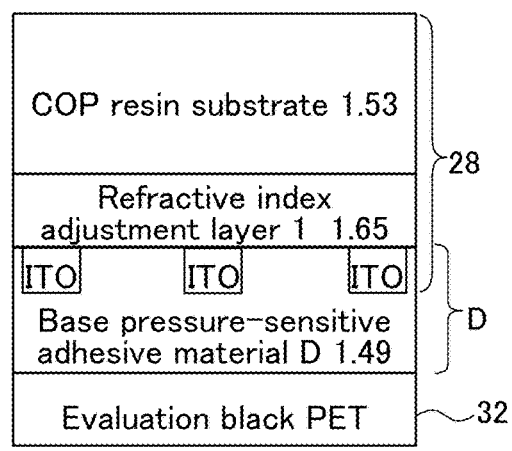
FIG. 10(d) depicts a configuration of an optical element laminate in Comparative Example 4.

An optical element laminate depicted in FIG. 10(d) was produced. Specifically, except that the refractive index adjustment zone-formed pressure-sensitive adhesive (D1) to be laminated was changed to the base pressure-sensitive adhesive material D devoid of the refractive index adjustment zone, a transparent electroconductive layer-equipped cover laminate (H) was produced in the same manner as that in Inventive Example 4.

A list of Inventive and Comparative Examples and a result of the reflectance measurements are presented in the following Table.

TABLE 2

| | Optical Laminate | Pressure-Sensitive Adhesive laminated to Electroconductive Layer | | | | Removed portion of transparent electroconductive layer Reflectance (Y %) | Pattern Invisibility | | |
|---|---|---|---|---|---|---|---|---|---|
| | | Type of refractive index adjustment zone-formed pressure-sensitive adhesive | Thickness | Non-removed portion of transparent electroconductive layer | | | | | |
| | | | | Reflection (Y %) | Reflectance suppressin rate | | Reflectance difference (%) | Color difference value (ΔE*ab) | Comprehensive evaluation |
| Inventive Example 1 | Cover element laminate (A) | Pressure-sensitive adhesive A1 | 200 | 5.8 | −0.5 | 5.3 | 0.6 | 2.9 | ○ |
| Inventive Example 2 | Cover element laminate (B) | Pressure-sensitive adhesive B1 | 175 | 2.7 | −0.4 | 2.2 | 0.5 | 2.6 | ○ |
| Inventive Example 3 | Cover element laminate (C) | Pressure-sensitive adhesive C1 | 200 | 4.7 | −0.6 | 4.7 | 0.0 | 0.9 | ◎ |
| Inventive Example 4 | Cover element laminate (D) | Pressure-sensitive adhesive D1 | 100 | 5.0 | −0.3 | 5.0 | 0.0 | 1.7 | ○ |
| Comparative Example 1 | Cover element laminate (E) | Pressure-sensitive adhesive A | 200 | 6.3 | — | 5.1 | 1.2 | 4.9 | X |
| Comparative Example 2 | Cover element laminate (F) | Pressure-sensitive adhesive Ba | 175 | 3.1 | — | 1.8 | 1.3 | 8.8 | X |
| Comparative Example 3 | Cover element laminate (G) | Pressure-sensitive adhesive C | 200 | 5.3 | — | 5.2 | 0.1 | 4.5 | Δ |
| Comparative Example 4 | Cover element laminate (H) | Pressure-sensitive adhesive D | 100 | 5.3 | — | 5.2 | 0.1 | 4.5 | Δ |

[Evaluation Method]

<Measurement of Single Transmittance and Polarization Degree of Polarizer>

A single transmittance (Ts), a parallel transmittance (Tp) and a crossed transmittance (Tc) of a polarizing plate were measured using a UV-visible spectrophotometer (V7100 manufactured by JASCO Corporation), and a polarization degree (P) was derived from the following formula:

$$\text{Polarization degree } (P) \ (\%) = \{(Tp-Tc)/(Tp+Tc)\} \times (\frac{1}{2}) \times 100$$

Each value of Ts, Tp and Tc is a Y value measured by the 2-degree visual field (C light source) of JIS Z8701 and corrected for spectral luminous efficacy.

<Measurement of Weight Average Molecular Weight (Mw) of Acryl-Based Polymer>

A weight average molecular weight of the produced acryl-based polymer was measured by gel permeation chromatography (GPC).

Apparatus: HLC-8220 GPC manufactured by TOSOH CORPORATION

Column: Sample column; TSKguardcolumn Super HZ-H (one column) and TSKgel Super HZM-H (two columns), manufactured by TOSOH CORPORATION Reference column; TSKgel Super H-RC (one column), manufactured by TOSOH CORPORATION Flow rate: 0.6 mL/min Injection amount: 10 μL Column temperature: 40° C.

Eluent: THF

Concentration of injected sample: 0.2 weight %

Detector: differential refractometer

The weight average molecular weight was calculated in terms of polystyrene.

<Observation of Surface State of Pressure-Sensitive Adhesive Layer>

Figure 11:
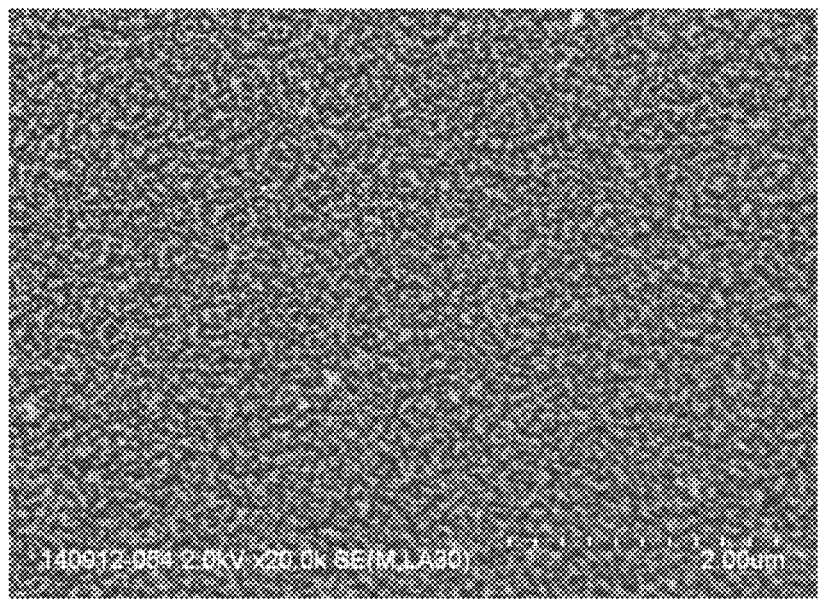
FIG. 11 is a 20000×SEM photograph presenting a surface state of a refractive index adjustment zone of a pressure-sensitive adhesive layer produced in one Inventive Example.

In each Inventive Example, the surface of the pressure-sensitive adhesive layer having the high refractive index material particles was observed using a field emission scanning electron microscope (FE-SEM) at an acceleration voltage of 2 kV, and at respective magnifications: 500 times, 2,000 times, 5,000 times and 20,000 times. A SEM photograph at a magnification of 20,000 times is presented in FIG. 11. The SEM photograph shows that the high refractive index material particles are uniformly dispersed.

<Observation of Gradation-Processed Microstructure>

Figure 12:
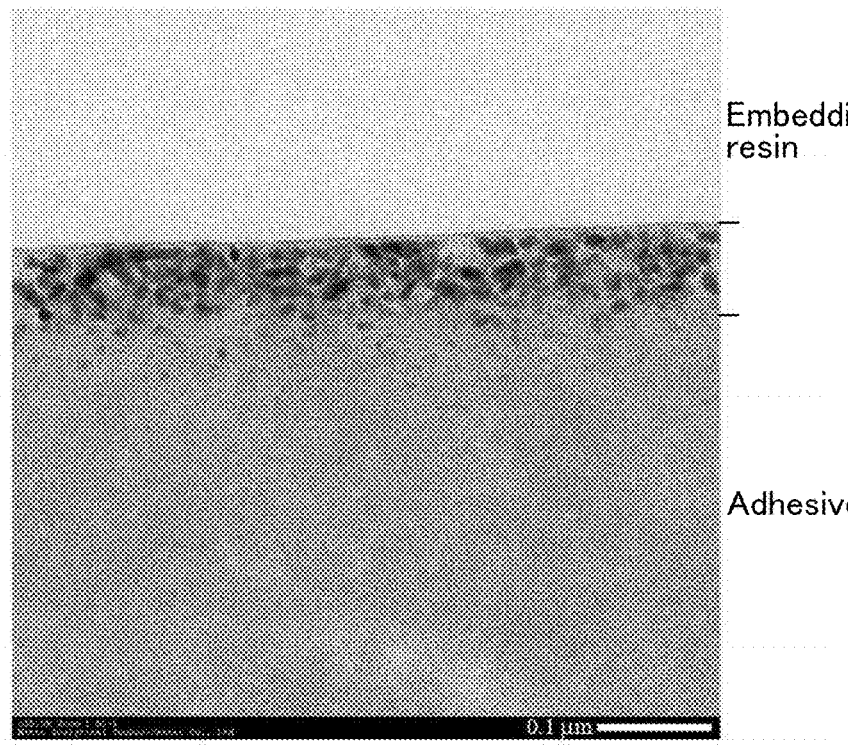
FIG. 12(a) is a 30000×TEM cross-sectional photograph presenting a high refractive index material particle distribution in a refractive index adjustment zone of a pressure-sensitive adhesive layer obtained in another Inventive Example.
FIG. 12(b) is a 30000×TEM cross-sectional photograph presenting a high refractive index material particle distribution in a refractive index adjustment zone of a pressure-sensitive adhesive layer obtained in another Inventive Example.
Figure 12:
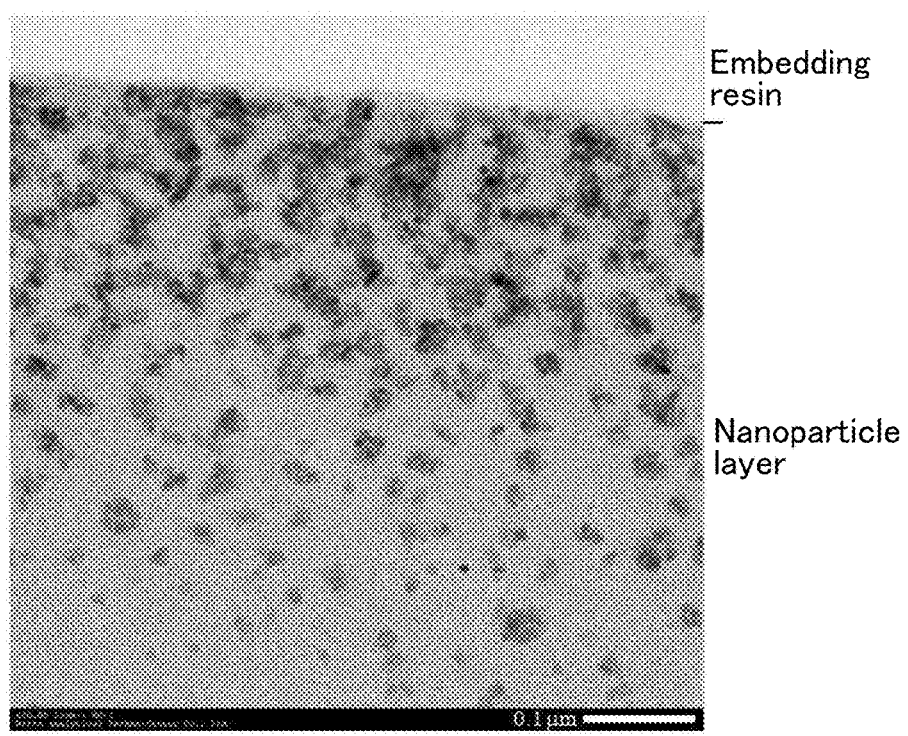

In two Inventive Examples, a cross-section adjacent to the surface of the pressure-sensitive adhesive layer having the high refractive index material particles was observed using a transmission electron microscope (TEM) at a magnification of 30,000 times. Results of the observation are presented in FIGS. 12(a) and 12(b). FIG. 12(a) shows that the high refractive index material particles are approximately uniformly distributed over approximately the entire thickness of the refractive index adjustment zone, whereas FIG. 12(b) shows that a distribution density of the high refractive index material particles in the pressure-sensitive adhesive layer is maximized at one surface of the pressure-sensitive adhesive layer, and gradually reduced toward the other surface in a thickness direction of the pressure-sensitive adhesive layer.

<Average Interfacial Refractive Index>

An average interfacial refractive index of the pressure-sensitive adhesive layer obtained in each of Inventive Examples and an average interfacial refractive index of the base pressure-sensitive adhesive material layer obtained in each of Comparative Examples were calculated by measuring refractive indexes in the sodium D-lines (589 nm) using a spectroscopic ellipsometer ("EC-400" manufactured by JA. Woolam Co.). In each of the pressure-sensitive adhesive layers of Inventive and Comparative Examples, the separator sheets on the opposite surfaces of the pressure-sensitive adhesive layer were peeled off, and a black plate was laminated to a non-particle infiltration-side one of the surfaces. In this state, an average interfacial refractive index at the other surface, i.e., the particle infiltration-side surface, was measured. On the other hand, in each of the pressure-sensitive adhesive layers (base pressure-sensitive adhesive material layers) of Comparative Examples, two separator sheets on respective opposite surfaces of the pressure-sensitive adhesive layer were peeled off, and then a black plate was laminated to one of the surfaces. In this state, an average interfacial refractive index at the other surface of the pressure-sensitive adhesive layer was measured.

<Measurement of Thickness of Refractive Index Adjustment Zone (Sublayer)>

A cross-section of the pressure-sensitive adhesive layer in a depth direction was adjusted to perform TEM observation. Based on the resulting TEM image (direct magnification: 3,000 to 30,000 times), a thickness of the refractive index adjustment zone was measured. The thickness of the refractive index adjustment zone was determined as an average value of undulation of the interface between the base adhesive zone (sublayer) and the refractive index adjustment zone. In a situation where it was difficult to identify the interface between the base adhesive zone and the refractive index adjustment zone, an interfacial TEM image was subjected to binary image processing using image processing software (Image J), and a depth in a region where 90% of the nanoparticles exists was determined as the thickness of the refractive index adjustment zone.

<Area Ratio of High Refractive Index Material Particles>

The particle infiltration-side surface of the pressure-sensitive adhesive layer was observed using FE-SEM at an acceleration voltage of 2 kV, and at respective magnifications: 500 times, 2,000 times and 5,000 times. The resulting interfacial SEM image was subjected to binary image processing using image processing software (ImageJ) to measure an area of the high refractive index material particles in a rectangular region having a long side length of 23 μm and a short side length of 18 μm so as to calculate an area ratio (%) of the high refractive index material particles to the entire rectangular region.

<Total Light Transmittance & Haze Value>

In each of the pressure-sensitive adhesive sheets obtained in Inventive and Comparative Examples, a particle infiltration-side one of the separator sheets was peeled off, and the resulting exposed surface was attached to a glass slide (trade name—"ShiroKenma No. 1", manufactured by Matsunami Glass Ind., Ltd., thickness: 0.8 to 1.0 mm, total light transmittance: 92%, haze: 0.2%). Then, the other separator sheet was further peeled off to produce a test piece having a three-layered structure of the base adhesive sublayer, the refractive index adjustment sublayer, and the glass slide. On the other hand, in each of the pressure-sensitive adhesive sheets obtained in Comparative Examples, one of the separator sheets was peeled off, and the resulting exposed surface was attached to a glass slide (trade name: "ShiroKenma No. 1", manufactured by Matsunami Glass Ind., Ltd., thickness: 0.8 to 1.0 mm, total light transmittance: 92%, haze: 0.2%). Then, the other separator sheet was further peeled off to prepare a test piece having a two-layered structure of the base pressure-sensitive adhesive material layer and the glass slide. For each of the test pieces, a total light transmittance and a haze value in a visual light range were measured using a haze meter (device name—HM-150, manufactured by Murakami Color Research Laboratory Co., Ltd).

<Adhesive Force During 180-Degree Peeling (Adhesive Force with Respect to Glass Plate During 180-Degree Peeling>

A piece having a length of 100 mm and a width of 25 mm was cut from each of the pressure-sensitive adhesive sheets obtained in Inventive and Comparative Examples. Then, in each of the cut pieces of Inventive and Comparative Examples, a non-particle infiltration-side one of the separator sheets was peeled off, and a PET film (trade name—"LUMIRROR S-10", manufactured by TORAY Industries Inc., thickness: 25 μm) was attached (lined) to the exposed surface. On the other hand, in each of the cut pieces of Comparative Examples 1 and 2, one of the separator sheets was peeled off, and a PET film (trade name: "LUMIRROR S-10", manufactured by TORAY Industries Inc., thickness: 25 μm) was attached (lined) to the exposed surface. Subsequently, the other separator sheet was peeled off, and then the cut piece was press-bonded to a glass plate (trade name—"Soda-Lime Glass #0050", manufactured by Matsunami Glass Ind., Ltd.) as a test plate, under press-bonding conditions: 2 kg roller; and one stroke, to produce a sample having a three-layered structure of the test plate. Each of the obtained samples was subjected to an autoclave treatment (50° C., 0.5 MPa, 15 minutes), and then subjected to cooling in an atmosphere at 23° C. and 50% R.H., for 30 minutes. After the cooling, the pressure-sensitive adhesive sheet (the pressure-sensitive adhesive layer and one PET film) was peeled off from the test plate to measure an adhesive force (N/25 mm) during 180-degree peeling, using a tension tester (device name: Autograph, manufactured by Shimadzu Corp.) according to JIS Z0237, in an atmosphere at 23° C. and 50% R.H., under conditions including a tension rate of 300 mm/minute and a peeling angle of 180 degrees. Further, in each of Inventive and Comparative Examples, a pressure-sensitive adhesive sheet of the base pressure-sensitive adhesive material before the infiltration of the high refractive index material particles was prepared, and an adhesive force during 180-degree peeling was measured in the same manner as above.

<Transmittance of High Refractive Index Particle-Containing Dispersion Liquid>

A transmittance of the high refractive index particle-containing dispersion liquid was measured by a photoelectrometer (AC-114 manufactured by Optima Inc.) using a 530 nm filter. On the assumption that a transmittance of the dispersion medium itself is 100%, a transmittance (%) of the dispersion liquid used in Inventive and Comparative Examples was calculated.

<Measurement of Reflection Suppression Rate and Reflection Hue (b*)>

A sample for reflectance measurement was prepared such that one of the opposite surfaces of each of the optical element laminates in Inventive and Comparative Examples was used as a reflectance measuring surface, and a single-sided pressure-sensitive adhesive black PET sheet (PET75NBPET38, manufactured by Lintec Corporation) was attached to the other surface. A reflectance (Y value) of each of the optical element laminates on the side of the reflectance measuring surface, and a reflection hue (L*, a*, b* values: CIE 1976), were measured by a reflection spectrophotometer (U4100, manufactured by Hitachi High-Technologies Corp.). The measurement was performed at respective positions corresponding to an etched area and a non-etched area of the transparent electroconductive layer. That is, in the etched area (opening) of the transparent electroconductive layer, a reflectance at an interface between the refractive index adjustment zone of the pressure-sensitive adhesive layer and the substrate of the optical element laminate was measured. Further, in the non-etched area (patterned portion) of the transparent electroconductive layer, a reflectance at an interface between the refractive index adjustment zone of the pressure-sensitive adhesive layer and the transparent electroconductive layer was measured.

For each of the etched area and the non-etched area, a reflection suppression rate was calculated based on the following formula. In the following formula, "reflectance (%) in case devoid of the particles" means a reflectance of each of the optical element laminates in Comparative Examples (using no particle). That is, the reflection suppression rate is an index indicating how much the reflectance can be reduced by providing the refractive index adjustment zone.

$$\text{Reflection suppression rate (\%)} = \text{reflectance (\%)} - \text{reflectance (\%) in case devoid of the particles}$$

A reflection hue improvement rate was measured for each of the etched area and the non-etched area by deriving a difference in color value ($\Delta L^*$, $\Delta a^*$, $\Delta b^*$), and calculating a color-difference value ($\Delta E^*ab$) based on the following formula:

$$\text{Color-difference value}(\Delta E^*ab) = [(\Delta L^*)^2 + (\Delta a^*)^2 + (\Delta b^*)^2]^{(1/2)}$$

That is, the color-difference value ($\Delta E^*ab$) is an index indicating a difference in color between the etched area and the non-etched area.

Due to an influence of the refractive index adjustment zone (IM sublayer) of the cover element (resin plate), a difference in reflectance does not significantly appear, so that it is hard to clearly evaluate pattern invisibility. Thus, the reflected color difference ($\Delta E^*ab$) was added. Smaller $\Delta E^*ab$ means higher similarity in color ($\Delta E^*ab=0$ means identicalness in color). Generally, when $\Delta E^*ab$ is 1 or less, it is almost impossible to recognize a change in color. That is, a situation where a color difference is suppressed by suppressing short wavelength-side reflected light at the electroconductive layer (ITO) means that pattern visibility has been improved.

<Determination on Pattern Invisibility>

Evaluation on pattern invisibility was determined based on a difference in reflected color between a non-removed portion of the electroconductive layer and a removed portion of the electroconductive layer. When the reflectance difference (%) was equal to or greater than 1.0%, the laminate was evaluated as x. On the other hand, in a situation where the reflectance difference (%) was less than 1.0%, the laminate was evaluated as ⊙ when the color difference value was less than 1.0, or evaluated as ○ when the reflectance difference (%) was in the range of 1.0 to less than 3.0, or evaluated as Δ when the reflectance difference (%) was equal to or greater than 3.0.

As can be seen from the measurement result depicted in Table 2, the reflection suppression rates in Inventive Examples 1 to 4 using the transparent electroconductive layer-equipped cover laminates (A) to (D) were in the range of −0.6% to −0.3%. That is, reflection was suppressed by the refractive index adjustment zone-formed pressure-sensitive adhesives comprised in the transparent electroconductive layer-equipped cover laminates (A) to (D), to provide an improvement effect. The aforementioned determination on pattern invisibility was performed to evaluate the improvement effect in detail. As a result, the color difference value was in the range of 0.9 to 2.9, i.e., a good result could be obtained. On the other hand, in Comparative Examples 1 to 4 using the transparent electroconductive layer-equipped cover laminates (E) to (H) devoid of the refractive index adjustment zone-formed pressure-sensitive adhesive, reflection was not suppressed, so that no improvement effect could be observed. Specifically, the color difference value was in the range of 4.5 to 8.8, i.e., a good result could not be obtained. This shows that the transparent electroconductive layer-equipped cover laminates (A) to (D) in Inventive Examples are capable of effectively suppressing reflection.

INDUSTRIAL APPLICABILITY

As mentioned above, the present invention employs a pressure-sensitive adhesive layer for bonding a first optical element to a second optical element, wherein the refractive index adjustment zone having a refractive index greater than a refractive index of the base pressure-sensitive adhesive material is formed over a given range from a surface of the pressure-sensitive adhesive layer on the side of the second optical element, in the thickness direction of the pressure-sensitive adhesive layer. Thus, it becomes possible to suppress the situation where internal reflections of external light are returned through the first optical element. The present invention can be applied to an optical display device, such as a liquid crystal display device and an organic EL display device. In particular, the present invention can be advantageously applied to a touch panel type display device having a touch sensor.

LIST OF REFERENCE SIGNS

S: pressure-sensitive adhesive sheet
S1, S2: support (backing)
1: optical element laminate
2: first optical element
3, 13: transparent pressure-sensitive adhesive layer
3a, 13a: base adhesive zone
3b, 13b: refractive index adjustment zone
4: second optical element
7: transparent electroconductive layer
17: high refractive index material particle
19: dispersion liquid
20: base pressure-sensitive adhesive material layer
21: laminate
22: cover sensor (glass/resin)
23: refractive index adjustment zone-formed pressure-sensitive adhesive (IM sublayer-formed pressure-sensitive adhesive
24: image display (LCD, OLED)
25, 28: cover element
26: glass substrate
27, 31: ITO layer
29: COP substrate
30: refractive index adjustment layer
32: evaluation black PET
33: AR-Film

The invention claimed is:
1. A transparent electroconductive layer-equipped cover element comprising a cover element, a transparent electroconductive layer, and a transparent pressure-sensitive adhesive layer, wherein:
the transparent electroconductive layer is provided on an inner side of the cover element in a patterned manner;
the pressure-sensitive adhesive layer is made of a transparent base pressure-sensitive adhesive material and is a single-layer having two principal surfaces opposite to each other; and the pressure-sensitive adhesive layer comprises
a base adhesive zone made essentially of the transparent base pressure-sensitive adhesive material and formed over a given range from a first one of the two principal surfaces of the pressure-sensitive adhesive layer in a thickness direction of the pressure-sensitive adhesive layer; and
a transparent, adherent, refractive index adjustment zone formed over a given range from a second one of the two principal surfaces of the single-layered pressure-sensitive adhesive layer in the thickness direction;
the refractive index adjustment zone is in contact with the transparent electroconductive layer and includes the transparent base pressure-sensitive adhesive material and a material having a refractive index greater than a refractive index of the transparent base pressure-sensitive adhesive material in the single-layered pressure-sensitive adhesive layer;
the base adhesive zone is free from including the material having the refractive index greater than the refractive index of the base pressure-sensitive adhesive material; and
a boundary between the refractive index adjustment zone and the base adhesive zone in the pressure-sensitive adhesive layer is formed as an irregular undulating curve.

2. The transparent electroconductive layer-equipped cover element as recited in claim 1, wherein the cover element is a glass substrate or a transparent resin substrate.

3. The transparent electroconductive layer-equipped cover element as recited in claim 1, wherein the refractive index adjustment zone has a thickness of 20 nm to 600 nm.

4. The transparent electroconductive layer-equipped cover element as recited in claim 1, wherein the refractive index adjustment zone is formed by dispersing, in a pressure-sensitive adhesive material identical to the base pressure-sensitive adhesive material, particles of a high refractive index material having a refractive index greater than that of the pressure-sensitive adhesive material, to thereby increase an average refractive index of the refractive index adjustment zone.

5. The transparent electroconductive layer-equipped cover element as recited in claim 4, wherein the refractive index of the high refractive index material particles is in the range of 1.60 to 2.74.

6. The transparent electroconductive layer-equipped cover element as recited in claim 4, wherein the high refractive index material particles have an average primary particle size of 3 nm to 100 nm as measured by TEM observation.

7. The transparent electroconductive layer-equipped cover element as recited in claim 4, wherein a difference between the refractive index of the high refractive index material particles and the refractive index of the base pressure-sensitive adhesive material is in the range of 0.15 to 1.34.

8. The transparent electroconductive layer-equipped cover element as recited in claim 4, wherein the high refractive index material is one or more compounds selected from the group consisting of $TiO_2$, $ZrO_2$, $CeO_2$, $Al_2O_3$, $BaTiO_3$, $Nb_2O_5$ and $SnO_2$.

9. The transparent electroconductive layer-equipped cover element as recited in claim 1, wherein the refractive index adjustment zone is formed by adding, to a pressure-sensitive adhesive material identical to the base pressure-sensitive adhesive material, an organic material having a refractive index greater than that of the pressure-sensitive adhesive material, in the form of particle, polymer or oligomer, to thereby increase an average refractive index of the refractive index adjustment zone.

10. The transparent electroconductive layer-equipped cover element as recited in claim 9, wherein the refractive index of the base pressure-sensitive adhesive material is in the range of 1.40 to 1.55, and the refractive index of the organic material is in the range of 1.59 to 2.04.

11. The transparent electroconductive layer-equipped cover element as recited in claim 1, wherein the pressure-sensitive adhesive layer has a total light transmittance of 80% or more.

12. The transparent electroconductive layer-equipped cover element as recited in claim 4, wherein the high refractive index material particles partially exist in the form of an aggregate arising from aggregation of two or more thereof.

13. The transparent electroconductive layer-equipped cover element as recited in claim 4, wherein a refractive index $n_1$ of the transparent electroconductive layer, the refractive index $n_2$ of the refractive index adjustment zone and the refractive index $n_3$ of the base pressure-sensitive adhesive material satisfy the following relationship: $n_1 > n_2 > n_3$.

* * * * *